United States Patent [19]
Nose et al.

[11] Patent Number: 5,333,050
[45] Date of Patent: Jul. 26, 1994

[54] MEASURING METHOD AND APPARATUS FOR MEAUSRING THE POSITIONAL RELATIONSHIP OF FIRST AND SECOND GRATINGS

[75] Inventors: Noriyuki Nose, Machida; Kenji Saitoh, Yokohama; Koichi Sentoku, Atsugi; Minoru Yoshii, Tokyo, all of Japan

[73] Assignee: Canon Kabushiki Kaisha, Tokyo, Japan

[21] Appl. No.: 675,277

[22] Filed: Mar. 26, 1991

[30] Foreign Application Priority Data

Mar. 27, 1990 [JP] Japan .................. 2-080002

[51] Int. Cl.$^5$ ............................. G01B 11/02
[52] U.S. Cl. ..................... 356/356; 356/363; 356/401
[58] Field of Search ............ 356/356, 363, 401

[56] References Cited

U.S. PATENT DOCUMENTS

| | | | |
|---|---|---|---|
| 4,710,026 | 12/1987 | Magome et al. | 356/349 |
| 4,984,890 | 1/1991 | Tojo et al. | 356/356 |
| 4,988,197 | 1/1991 | Ishibashi et al. | 356/356 |
| 5,028,797 | 7/1991 | Abe et al. | 250/548 |

OTHER PUBLICATIONS

Suzuki, et al., "An Optical-Heterodyne Alignment Technique for Quarter-Micron X-Ray Lithography," Journal of Vacuum Science & Technology, B7, No. 6, Nov. 1988, pp. 1971 through 1976.

*Primary Examiner*—Samuel A. Turner
*Assistant Examiner*—LaCharles Keesee
*Attorney, Agent, or Firm*—Fitzpatrick, Cella, Harper & Scinto

[57] ABSTRACT

Disclosed is a method and apparatus for measuring a relative positional deviation between a first pattern and a second pattern, printed on an article such as a semiconductor wafer at different moments, the measurement being based on detection of interference of diffraction lights from at least one of the first and second printed patterns.

16 Claims, 31 Drawing Sheets

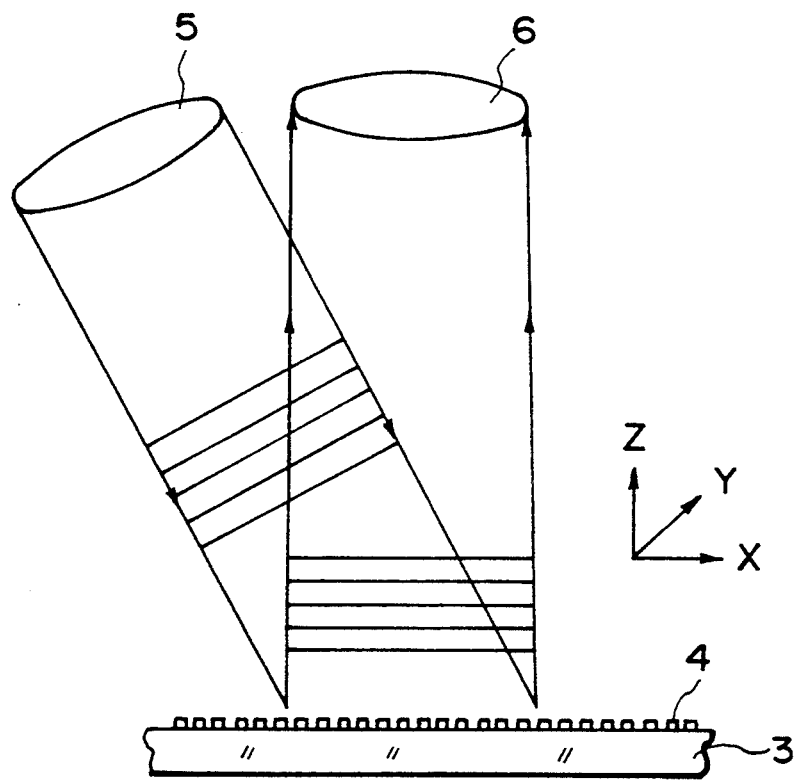
F I G. 1

- ○A: POS OF INCIDENCE OF LIGHT "A"
- ▲B: POS OF INCIDENCE OF LIGHT "B"
- ○As: POS OF EMISSION OF S-WAVE OF LIGHT "A"
- ○Ap: POS OF EMISSION OF P-WAVE OF LIGHT "A"
- △Bs: POS OF EMISSION OF S-WAVE OF LIGHT "B"
- △Bp: POS OF EMISSION OF P-WAVE OF LIGHT "B"

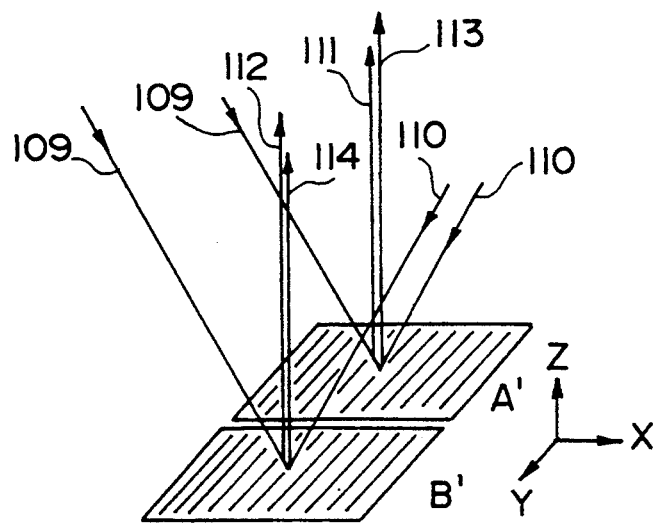
F I G. 10
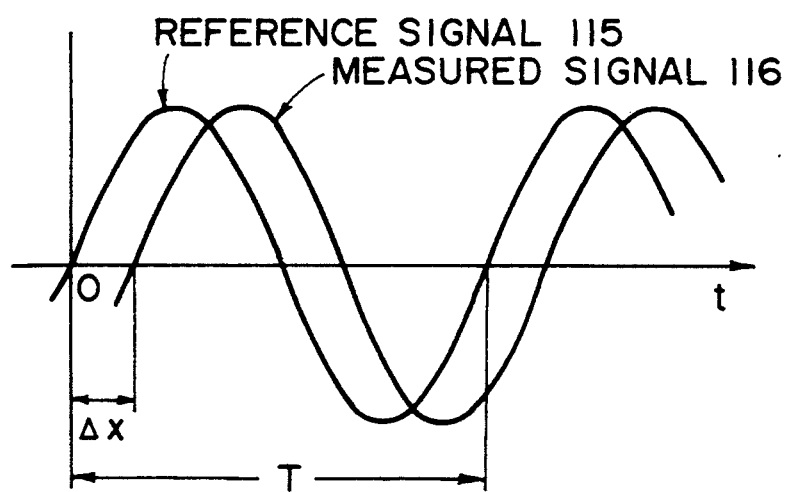
F I G. 11

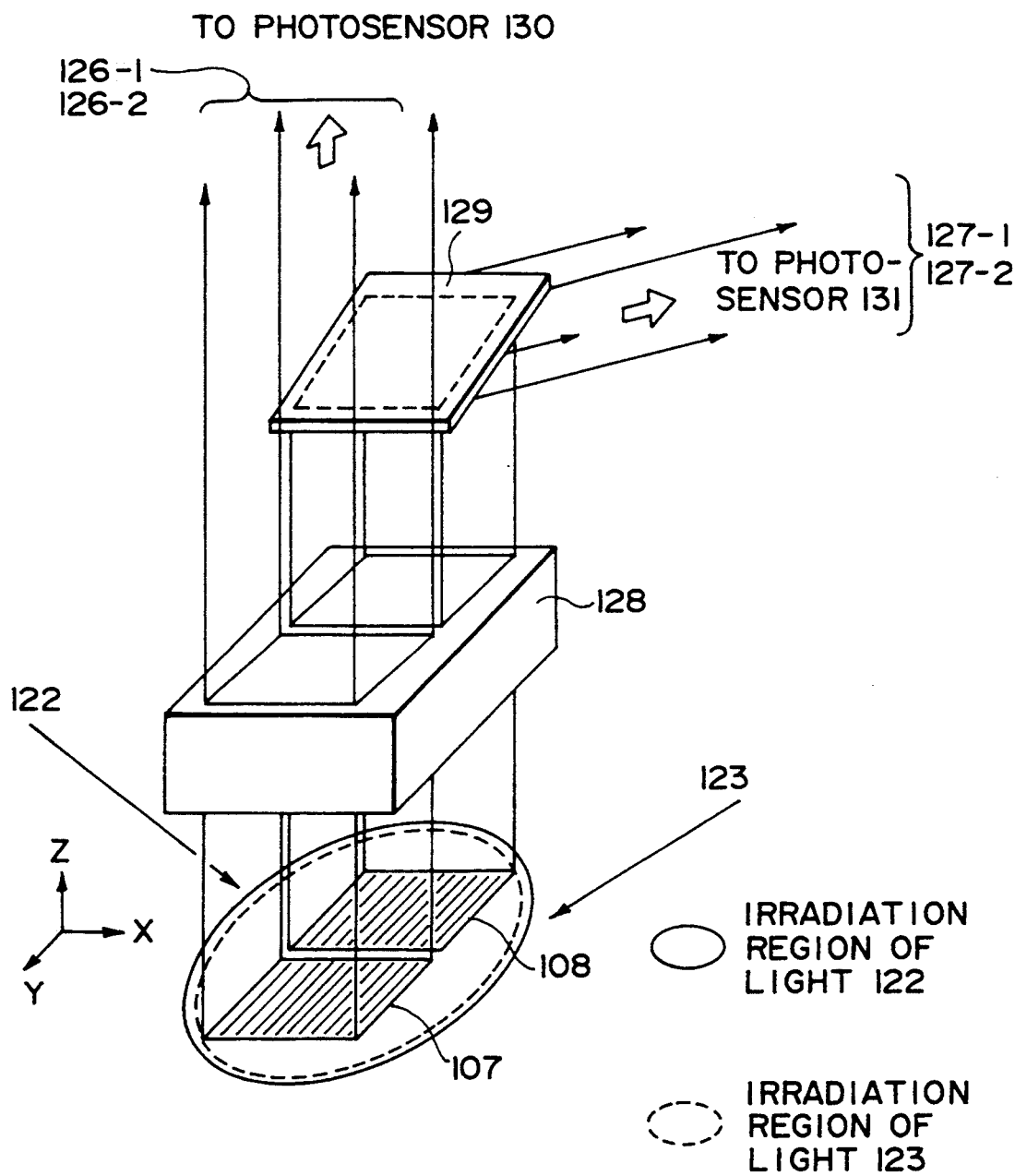
F I G. 14

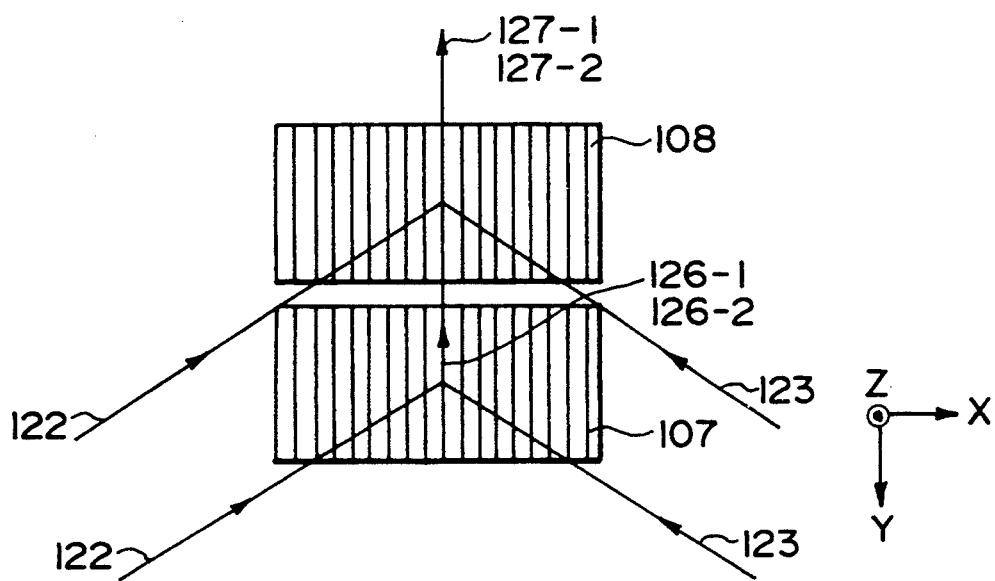
F I G. 19

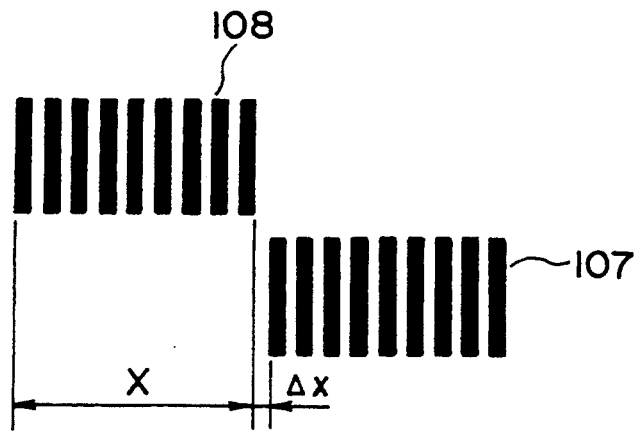
F I G. 20
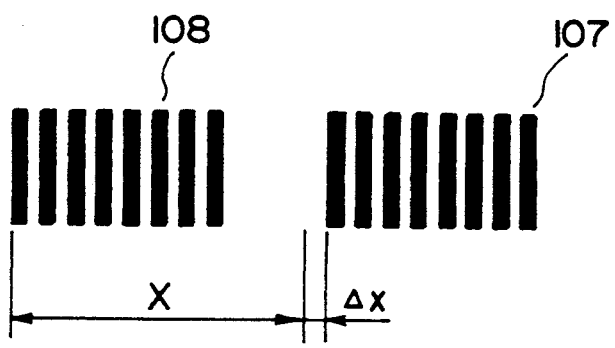
F I G. 21

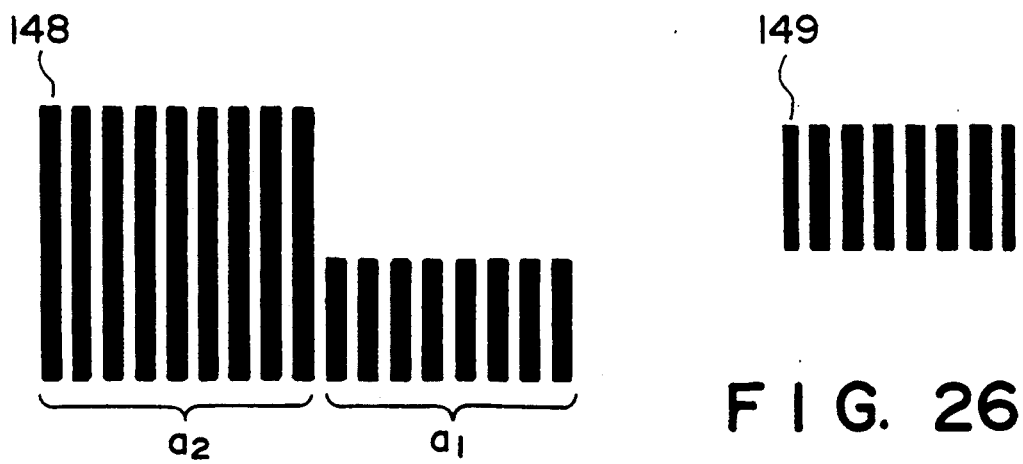
FIG. 25
FIG. 26
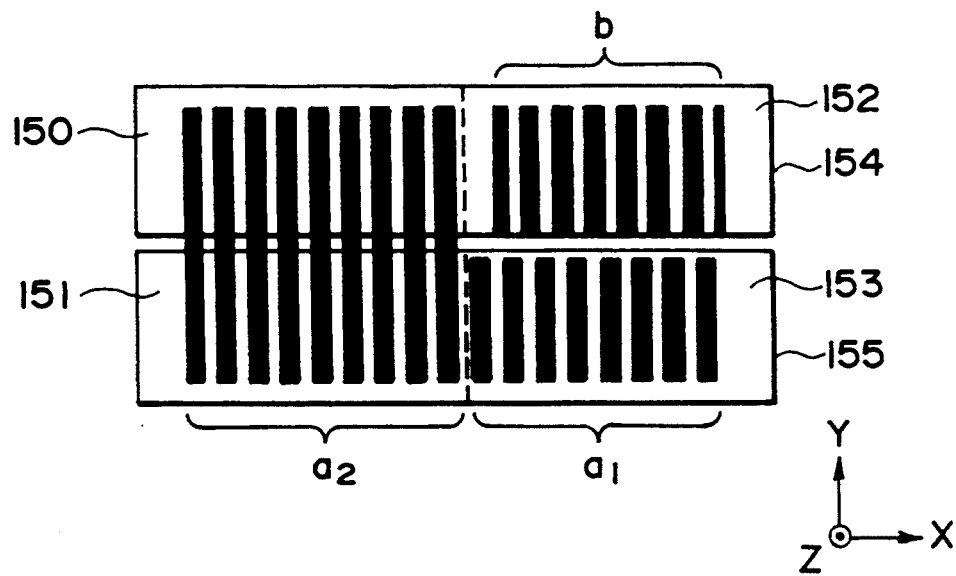
FIG. 27

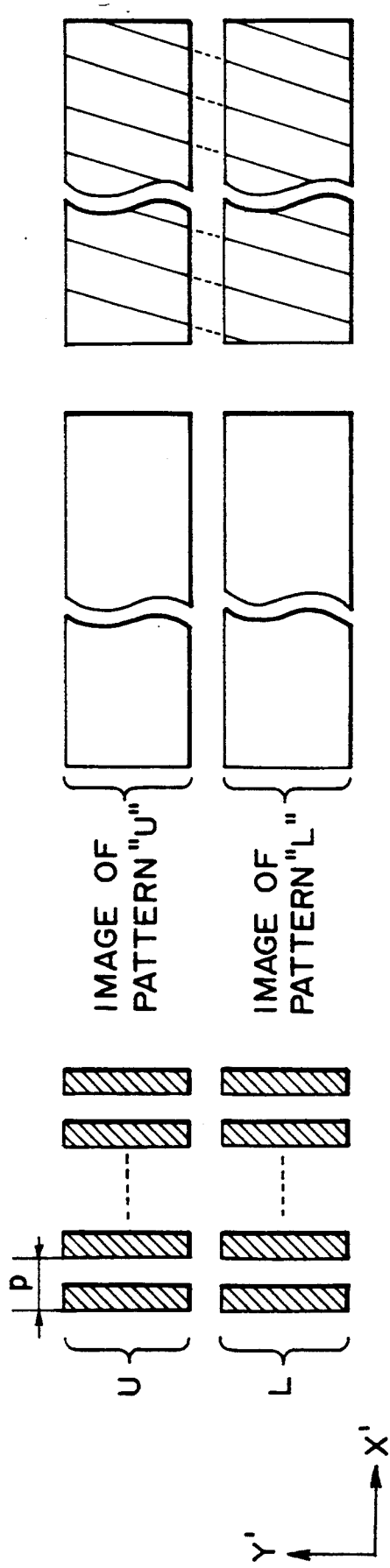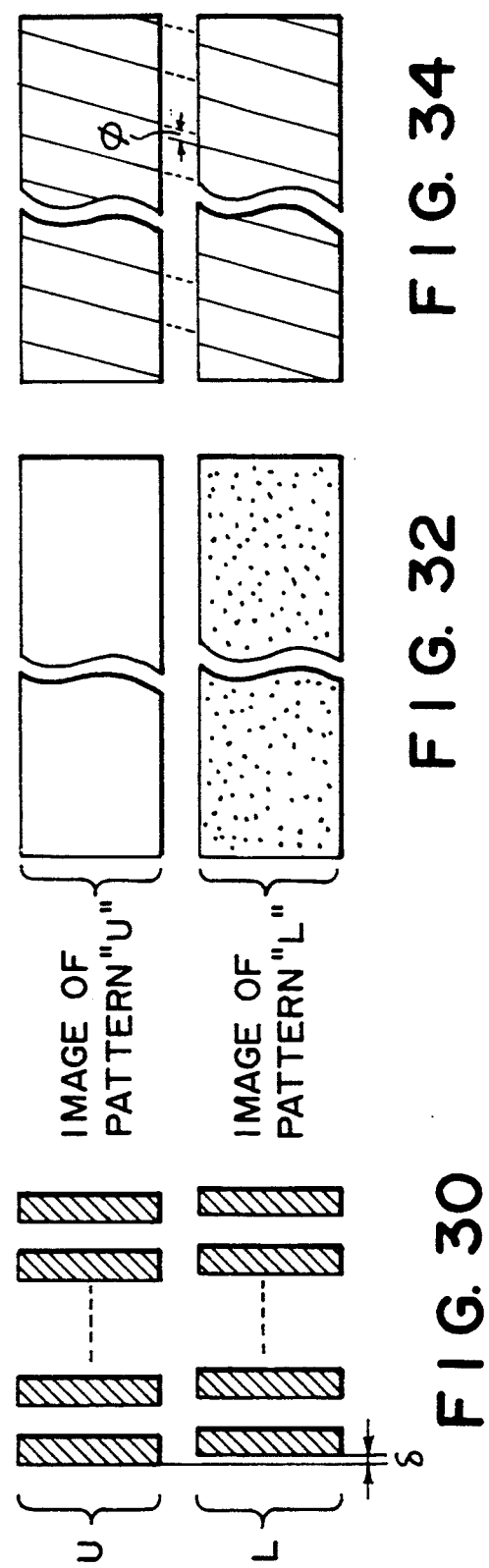
FIG. 33  FIG. 34  FIG. 31  FIG. 32  FIG. 29  FIG. 30

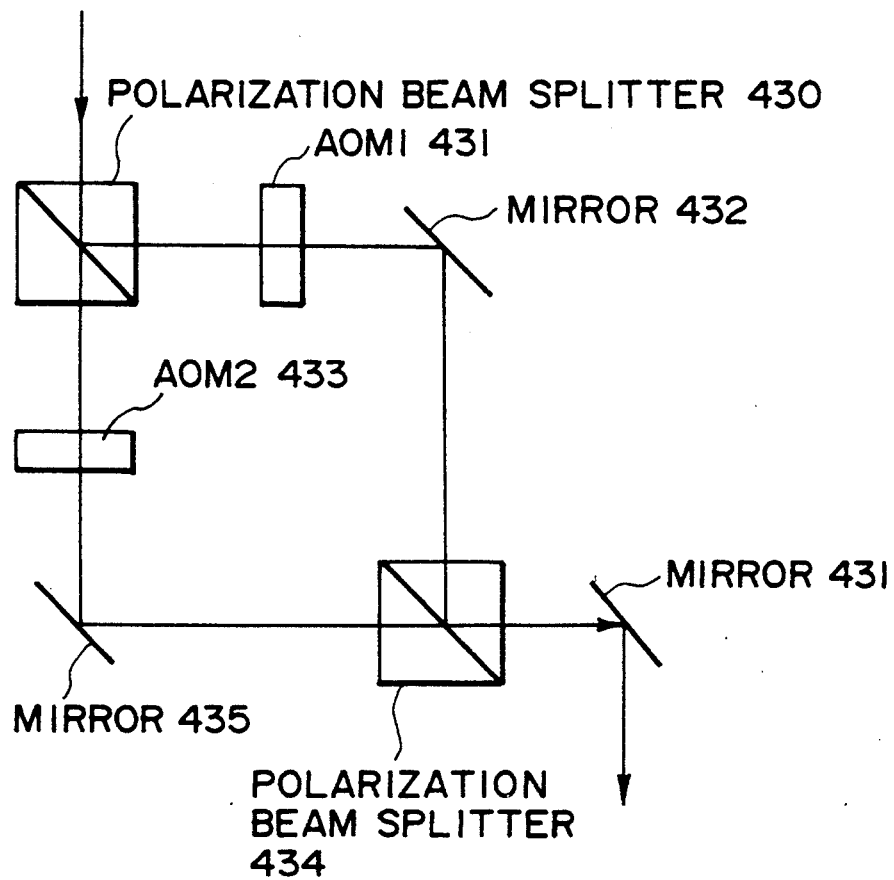
F I G. 36
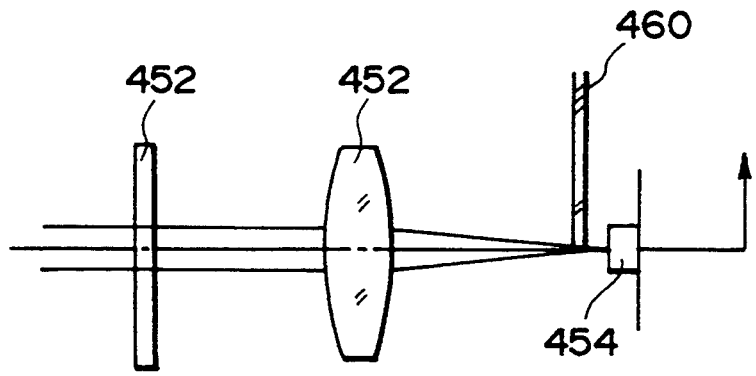
F I G. 38

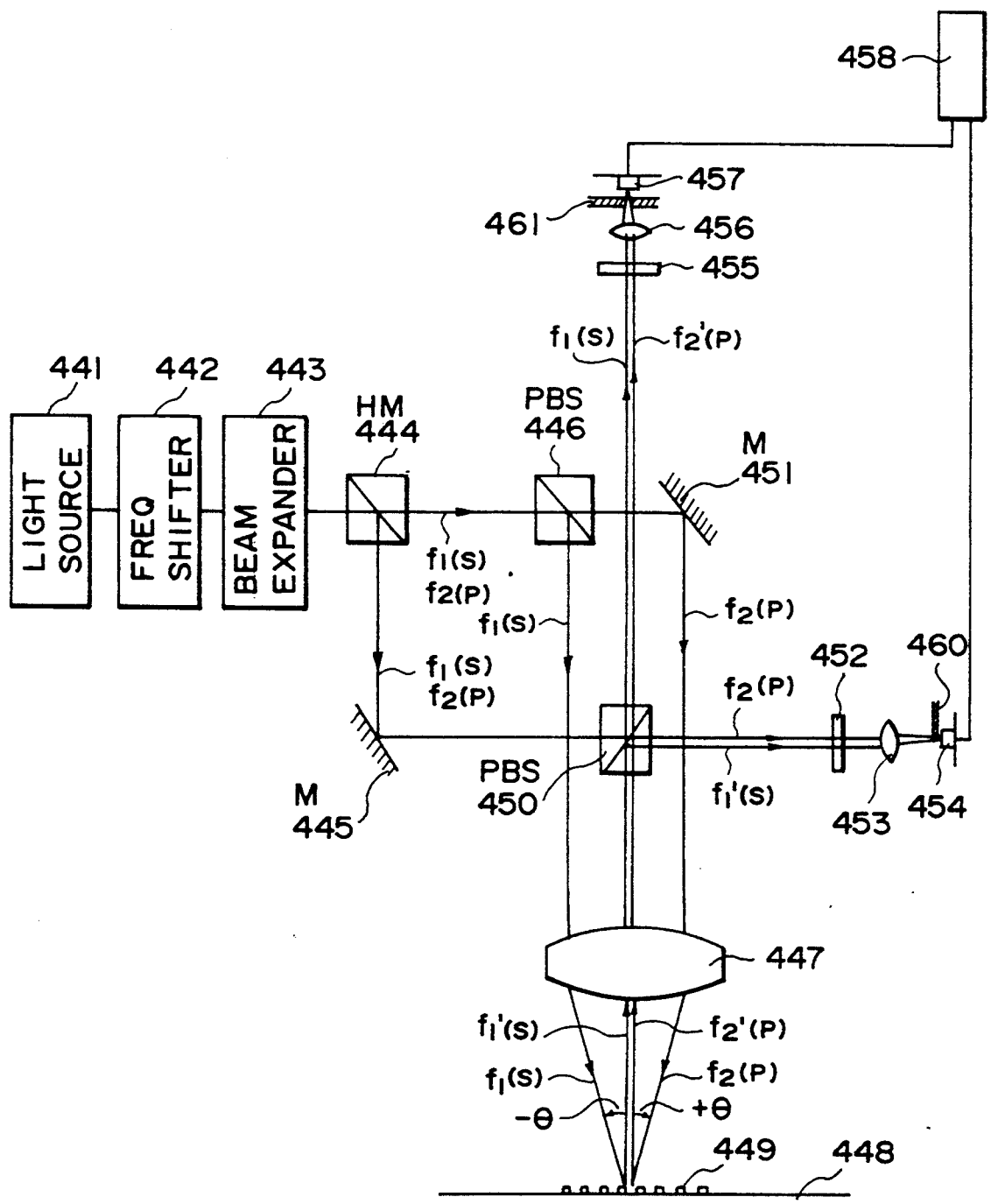
F I G. 37

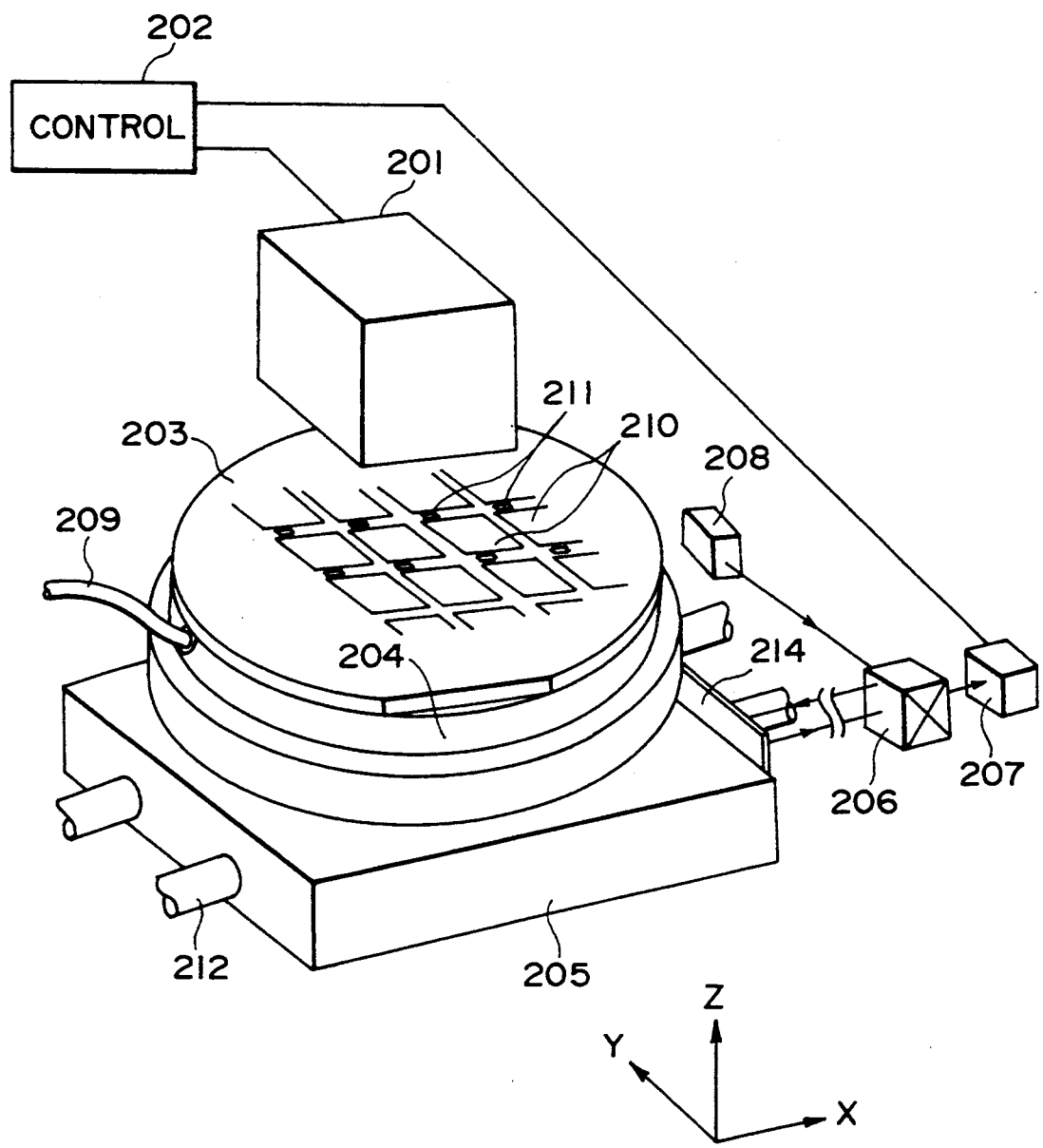
F I G. 39

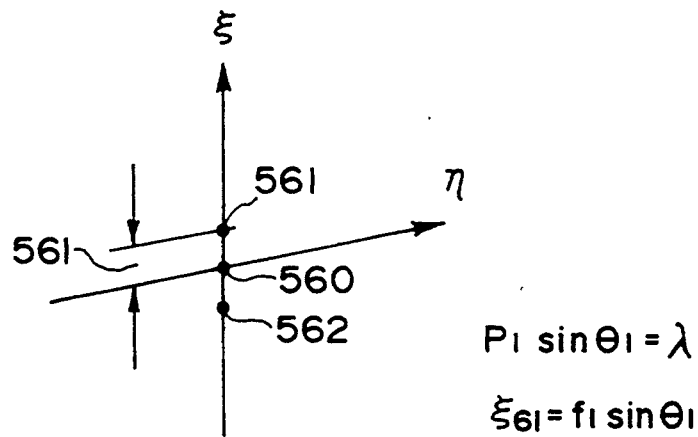
$P_1 \sin\Theta_1 = \lambda$
$\xi_{61} = f_1 \sin\Theta_1$
F I G. 46
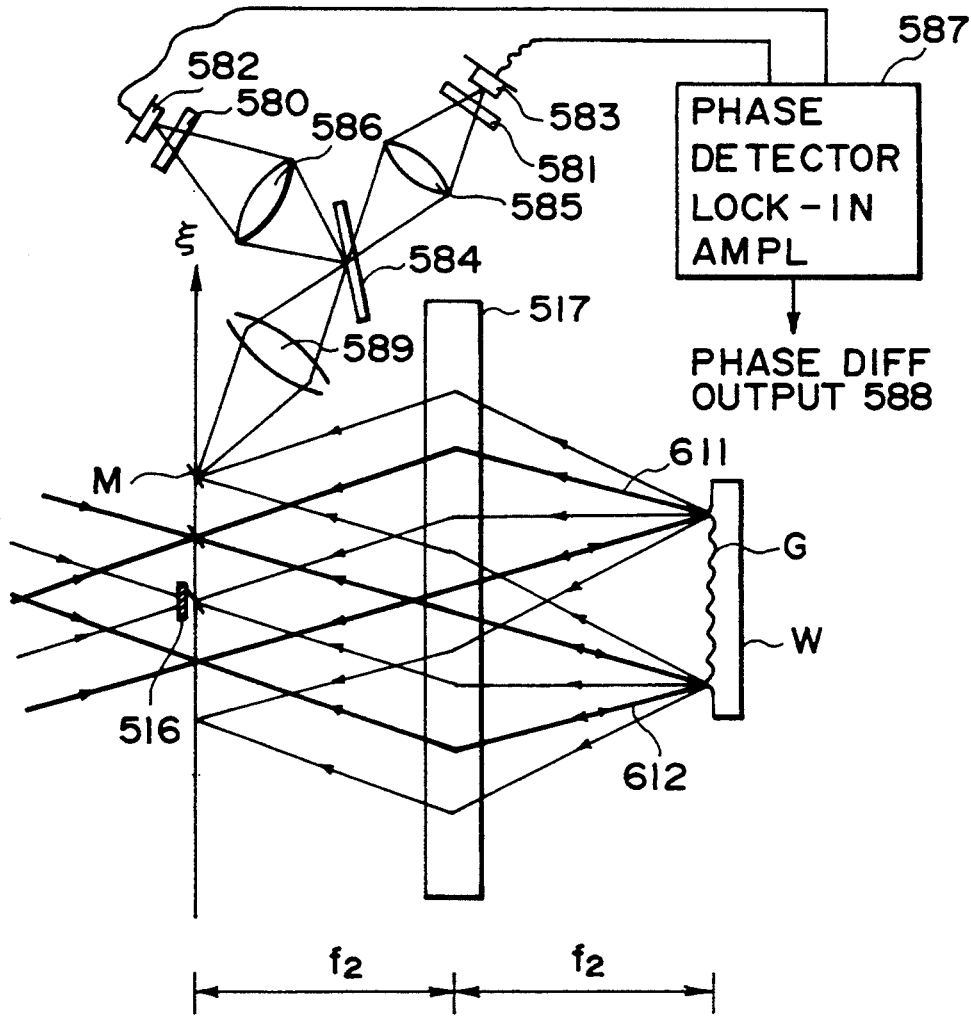
F I G. 47

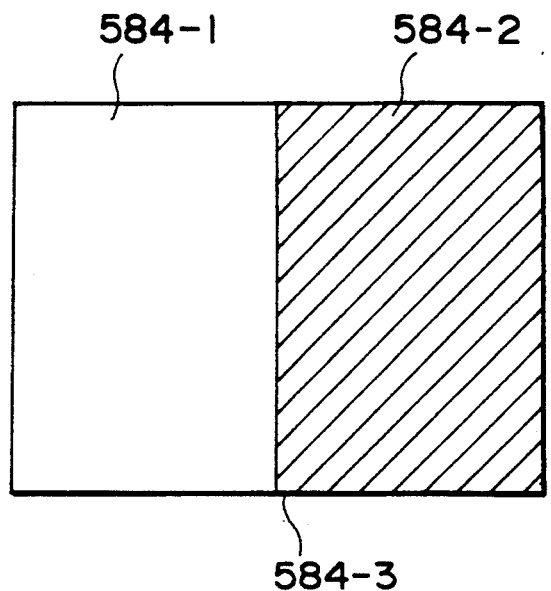
F I G. 51
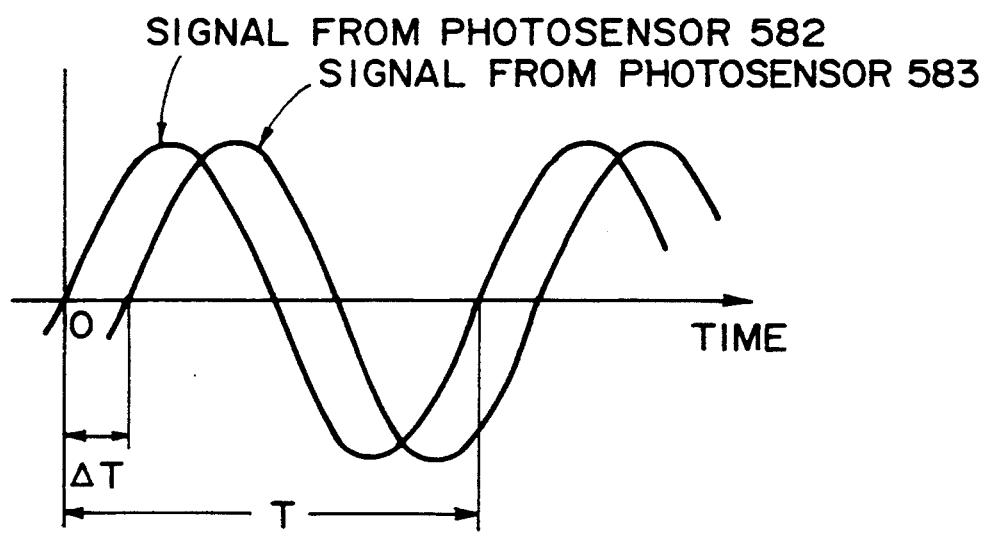
F I G. 52

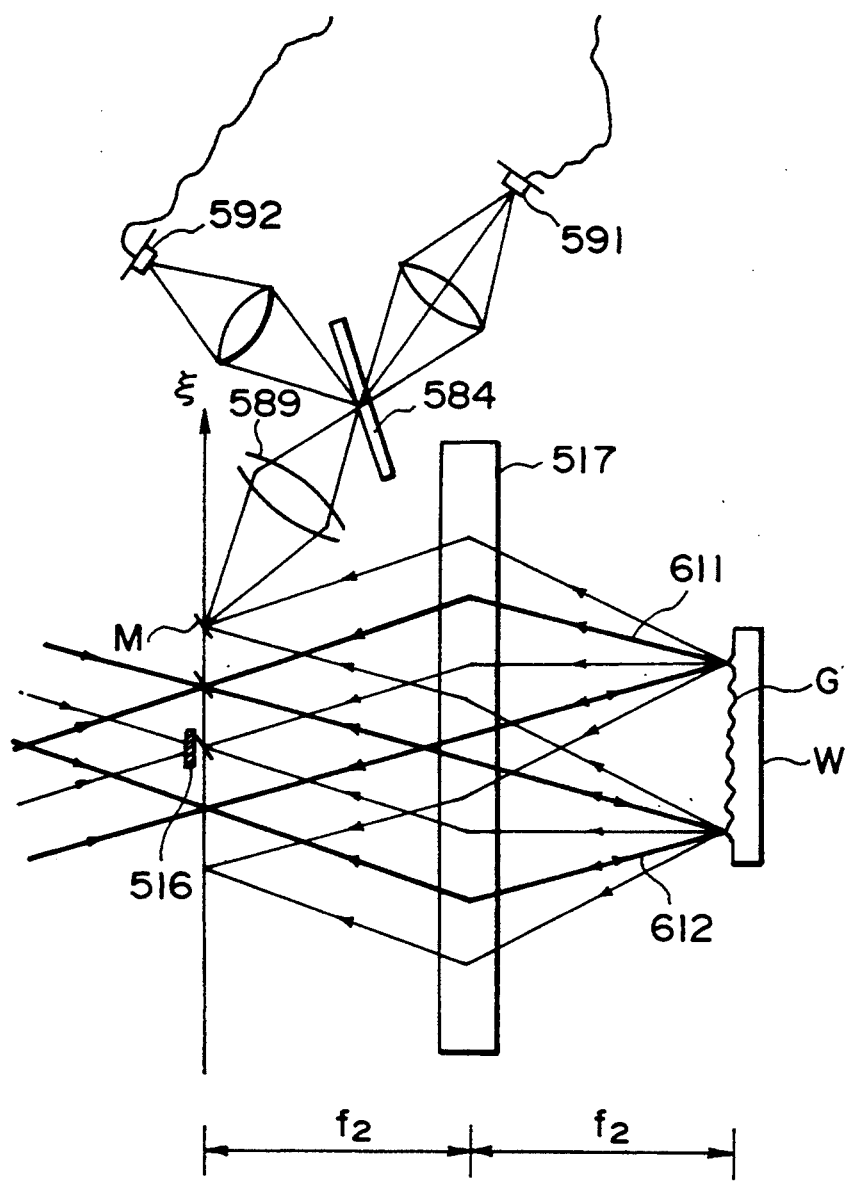
F I G. 53

MEASURING METHOD AND APPARATUS FOR MEAUSRING THE POSITIONAL RELATIONSHIP OF FIRST AND SECOND GRATINGS

FIELD OF THE INVENTION AND RELATED ART

This invention relates to a measuring method and apparatus. More particularly, the invention is concerned with a measuring method and apparatus which is usable, for example, in an exposure apparatus for manufacture of semiconductor devices, for measuring or inspecting the correctness in superposition of printed patterns on a photosensitive material, on an occasion when electronic circuit patterns formed on articles such as masks or reticles (hereinafter simply termed a "reticle") or those memorized as pattern data are printed superposedly upon one and the same substrate such as a semiconductor wafer, having a photosensitive material.

In a lithographic exposure apparatus for manufacture of semiconductor devices wherein a circuit pattern of a reticle is transferred and printed on a photosensitive material of a wafer by using ultraviolet light, X-rays or the like, relative alignment of the reticle and the wafer is one important factor for attaining enhanced performance. Particularly, in the alignment process in recent exposure apparatuses, alignment precision higher than a submicron order is required to meet the increasing degree of integration of semiconductor devices.

In many alignment systems, features called "alignment patterns" for the alignment purpose are provided on a reticle and a wafer and, by using positional information obtainable therefrom, the reticle-to-wafer alignment is effected. For actual measurement and evaluation of the alignment performance of an assembled apparatus, i.e., an exposure apparatus, conventionally a fine pattern formed on a reticle is superposedly printed on a wafer and any misregistration of the printed pattern with a pattern already formed on the wafer is measured through visual observation or image processing.

With the measurement through visual observation, there are inconveniences such as:

(1) It depends largely on the experience or skillfulness of an operator and, therefore, the measurement precision is not stable.

(2) Since the measurement is not effected automatically, it requires time-consuming and complicated operations.

(3) It is difficult to obtain high measurement precision.

Also, with the measurement through the image processing, there are inconveniences such as that the process is complicated and requires a long time, that it is difficult to obtain high measurement precision, and the like.

SUMMARY OF THE INVENTION

It is accordingly an object of the present invention to provide a method and apparatus for measuring or inspecting superposing precision or alignment precision of an alignment system, by which the measurement can be made automatically, the measuring time can be reduced and/or high measuring precision is obtainable stably.

It is another object of the present invention to provide an exposure apparatus for manufacture of semiconductor devices, wherein any misregistration between printed patterns in different layers can be measured.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 illustrates diffraction of light by a diffraction grating.

FIGS. 9, 10, 11, 12, 13, 14 and 15 are schematic views, respectively, of a second embodiment of the present invention.

FIGS. 17, 18 and 19 are schematic views, respectively, of a fourth embodiment of the present invention.

FIGS. 20 and 21 are schematic views, respectively, of a fifth embodiment of the present invention.

FIGS. 25, 26 and 27 are schematic views, respectively, of an eighth embodiment of the present invention.

FIGS. 28, 29, 30, 31, 32, 33 and 34 are schematic views, respectively, of a ninth embodiment of the present invention.

FIGS. 35 and 36 are schematic views, respectively, of a tenth embodiment of the present invention.

FIGS. 37 and 38 are schematic views, respectively, of an eleventh embodiment of the present invention.

FIGS. 39, 40, 41 and 42 are schematic views, respectively, of a twelfth embodiment of the present invention.

FIGS. 43, 44, 45, 46, 47, 48, 49, 50, 51 and 52 are schematic views, respectively, of a thirteenth embodiment of the present invention.

FIG. 53 is a schematic view of a fourteenth embodiment of the present invention.

DESCRIPTION OF THE PREFERRED EMBODIMENTS

Figure 2:
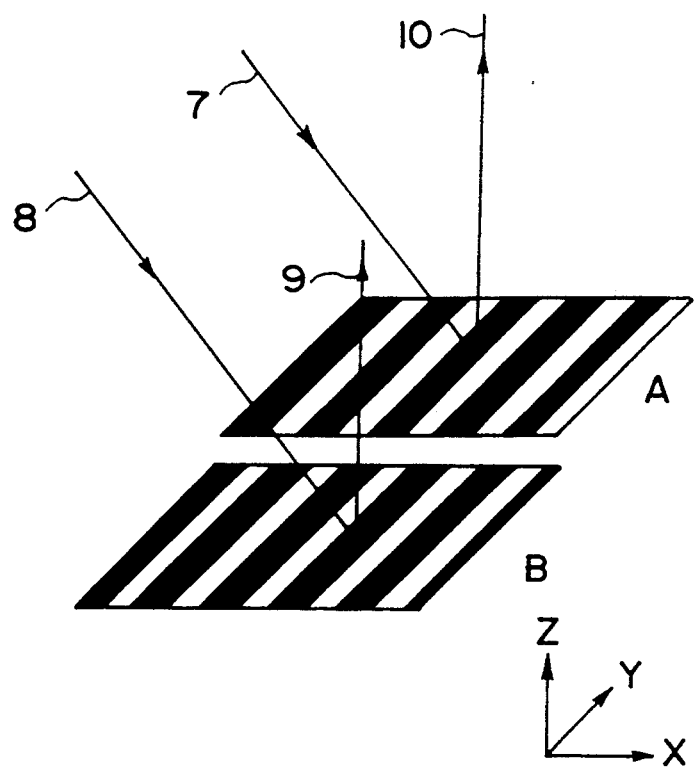
FIG. 2 illustrates diffraction of light by two adjacent diffraction gratings disposed on the same plane.

First, referring to some of the drawings, the principle of the first embodiment of the present invention will be explained.

FIG. 1 illustrates diffraction of light by a regular-pitch straight diffraction grating 4 (having straight grating lines extending in a direction perpendicular to the sheet of the drawing) which is provided on a substrate 3 and on which laser light 5 is incident as a plane wave, such that first-order diffraction light is diffracted perpendicularly to the surface of the substrate 3.

It is well known that, if the diffraction grating 4 of a pitch P displaces in the X direction by an amount corresponding to one pitch (unit pitch), the wavefront of the diffraction light 6 produced as a result of the impingement of the light 5 upon the diffraction grating 4 causes a phase shift of $2\pi$ (i.e. an amount corresponding to one wave length). Namely, if the grating moves in the X direction by $x_0$, a phase shift of $2m\pi x_0/P$ is added to the diffraction light, wherein m is the order of the diffraction light.

Referring to FIG. 2, two adjacent regular-pitch straight diffraction gratings placed on the same plane will now be considered. Here, the two gratings have the same pitch, but there is a deviation in the X direction between the adjacent linear patterns of these gratings. One of the gratings is denoted at A, while the other is denoted at B. Assuming that lights 7 and 8 having a small difference in frequency and having initial phases $\phi_{0A}$ and $\phi_{0B}$, respectively, are projected to the gratings A and B, respectively, the complex amplitudes of them are expressed by the following equations:

$$U_A = A_0 \exp\{i(\omega_A t + \phi_{0A})\} \quad (1)$$

$$U_B = B_0 \exp\{i(\omega_B t + \phi_{0B})\} \quad (2)$$

At this time, first-order diffraction lights 9 and 10 from these gratings are expressed as follows:

$$U_A' = A \exp\{i(\omega_A t + \phi_{0A} + \phi_A)\} \quad (3)$$

$$U_B' = B \exp\{i(\omega_B t + \phi_{0B} + \phi_B)\} \quad (4)$$

wherein $\phi_A = 2\pi X_A/P$ and $\phi_B = 2\pi X_B/P$ and wherein $X_A$ and $X_B$ are deviations in the X direction of the gratings A and B, respectively, from the same reference position.

When the lights as represented by equations (3) and (4) are caused to interfere with each other (i.e. superposed upon one another), the interference light has an intensity variation which is expressed as:

$$|U_A' + U_B'| = A^2 + B^2 + 2AB\cos\{2\pi(f_B - f_A)t + (\phi_B - \phi_A) + (\phi_{0B} - \phi_{0A})\} \quad (5)$$

wherein $f_A = \omega_A/2\pi$ and $f_B = \omega_B/2\pi$

In equation (5), $A^2 + B^2$ is a DC component and $2AB$ is an amplitude which corresponds to a difference in frequency of two light waves. It is in the form that a signal having a beat frequency component of $f_B - f_A$ is phase-modulated with time, by an initial phase difference $\phi_{0B} - \phi_{0A}$ and a phase difference $\phi_B - \phi_A$ that represents the quantity of deviation between the gratings.

If, therefore, the light is divided by a half mirror or the like before it impinges on the grating and if the lights $U_A$ and $U_B$ are superposed one upon another and are photoelectrically converted, then the signal of intensity change of the resultant interference light is:

$$|U_A + U_B|^2 = A_0^2 + B_0^2 + 2A_0B_0\cos\{2\pi(f_B - f_A)t + (\phi_{0B} - \phi_{0A})\} \quad (6)$$

By using this signal as a reference signal to detect a phase difference between the signals (5) and (6), it is possible to erase the initial signal phase deviation of the light and, therefore, it is possible to execute high-precision phase difference detection based on what is called "heterodyne interference measurement".

As is well known in the art, in the heterodyne method, a phase difference between two signals is detected with respect to time and, therefore, any difference in DC components between these signals or any change in amplitude does not affect the measurement.

Figure 3:
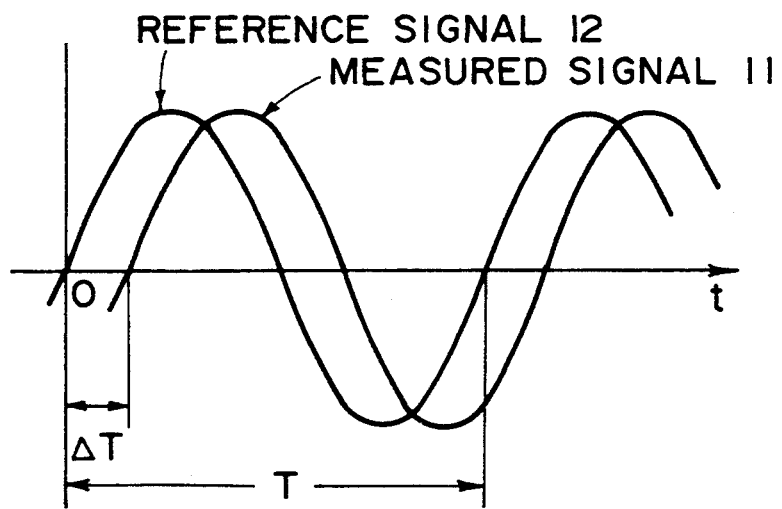
FIG. 3 illustrates a phase difference between a reference signal and a measured signal.

As shown in FIG. 3, by detecting a phase difference $\Delta T$ between a measured signal 11 and a reference signal 12, precisely, through a lock-in amplifier, for example, high-precision measurement of the phase difference is possible. For example, in consideration of the performance of a lock-in amplifier, practically a phase difference of $\lambda/1000 - \lambda/2000$ (0.4 degree - 0.2 degree phase) can be detected.

Since the phase difference as detected in the manner described above corresponds to the phase difference $\phi_B - \phi_A$ which represents the quantity of relative deviation of the gratings, if the grating pitch is P, the deviation between the gratings can be determined by $P(\phi_B - \phi_A)/2\pi$. For example, if a grating of a pitch of 2 microns is used, in order to ensure detection of relative deviation of the gratings of 0.01 micron, a capability of detection of a phase difference of (0.01 micron)/(2 microns) = 0.005, namely, $\lambda/200$ ($\lambda$ is the wavelength of light used for the heterodyne detection), is required.

In this embodiment, the quantity of relative deviation of the gratings as determined in accordance with the above-described principle, is used as the quantity of misregistration between a pattern printed at the first time and a pattern printed at the second time. This will be explained in detail.

First, a pattern of a first reticle is printed on a photosensitive material (resist) of a wafer. The first reticle has formed thereon a first actual device pattern and a first alignment mark of a well-known configuration as well as a first grating pattern corresponding to the above-described regular-pitch straight diffraction grating. The first actual device pattern, the first alignment mark and the first grating pattern are photoprinted simultaneously upon the resist by using a well-known type semiconductor exposure apparatus. After the printing, the resist is subjected to a developing process and the like, and after this a fresh resist is applied to the wafer. On this newly applied resist, patterns of a second reticle are printed. The second reticle has formed thereon a second actual device pattern and a second alignment mark of a well-known configuration as well as a second grating pattern comprising a regular-pitch straight diffraction grating, of the same pitch as the first grating pattern. The printing is made in a well-known semiconductor exposure apparatus, after the relative position of the second reticle and the wafer is detected by using the first alignment mark having been transferred to the wafer and the second alignment mark of the second reticle in accordance with a well-known method and after the relative position of the second reticle and the wafer is adjusted on the basis of the result of detection. The position of the second grating pattern is so designed that, if the second actual device pattern is exactly aligned with the first actual device pattern on the wafer without any misregistration, the second grating pattern is transferred on the wafer at a position adjacent to the first grating pattern thereon, as shown in FIG. 2, with its linear patterns registered in the X direction in FIG. 2 with the adjacent linear patterns of the first grating pattern. When the resist on which the second reticle is printed is developed, then both the first and second grating patterns are formed on the wafer. Any positional deviation between adjacent linear patterns of the first and second grating patterns with respect to the X direction in FIG. 2, is detected in accordance with the principle described hereinbefore. Such a positional deviation is equivalent to the quantity of misregistration between the first and second actual device patterns, and it represents the quantity of alignment error based on the first and second alignment marks.

The grating pattern to be formed is not limited to one resulting from development of a resist. As an example, one of or each of the first and second grating patterns may be formed by a latent image, that is, a pattern image which may appear on the resist, without development, as a result of transfer of a pattern to the resist. Further, it is not always necessary that one of or each of the first and second reticles have an actual device pattern. For example, when only an alignment error of a semiconductor exposure apparatus is to be measured, a test reticle having no actual device pattern may be used as the first or second reticle. Also, on that occasion, for example, the first grating pattern and the first alignment pattern may not be transferred from the first reticle. For example, they are formed by using a well-known type electron beam pattern drawing apparatus. Similarly, the second grating pattern and the second alignment pattern may not be transferred from the second reticle. Further, in place of using a photosensitive material, the substrate material may be processed directly by using an ion beam or the like. The alignment operation of the second reticle and the wafer is not limited to one based on alignment marks, but it may be one wherein a positioning stage on which a wafer is placed is moved through a certain amount relative to the second reticle, set at a predetermined position, to thereby align the wafer with the second reticle.

Figure 4:
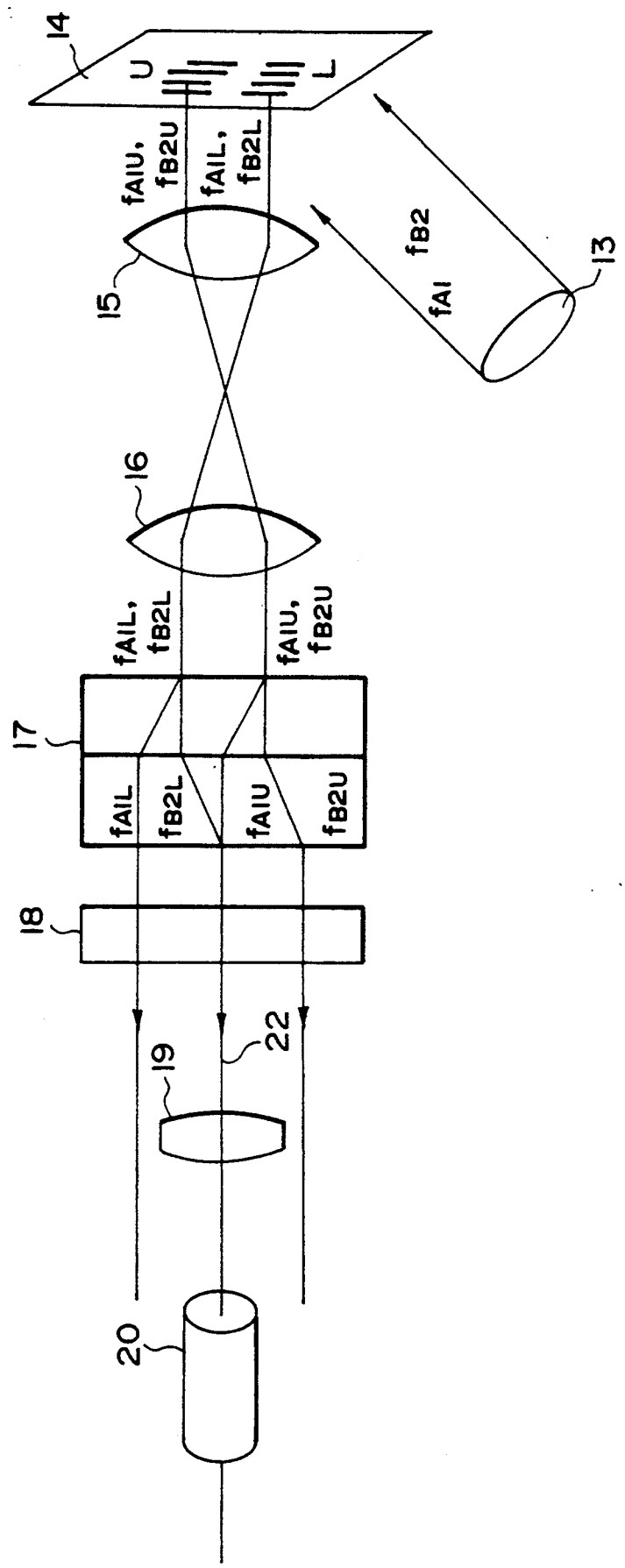
FIGS. 4, 5, 6, 7 and 8 are schematic views, respectively, of a first embodiment of the present invention.

Referring now to FIG. 4, the structure of a particular grating diffraction light detection system as well as a first embodiment of the present invention will be explained.

In FIG. 4, light 13 which includes lights $f_{A1}$ and $f_{B2}$ of two different frequencies $f_A$ and $f_B$, is projected on gratings U and L having been printed on a wafer 14, to be measured, in the manner described hereinbefore. Diffraction lights $f_{A1U}$ and $f_{B2U}$, emanating from the grating U as a result of diffraction thereby of the lights of different frequencies, as well as diffraction lights $f_{A1L}$ and $f_{B2L}$, emanating from the grating L as a result of diffraction thereby of the lights of different frequencies, are relayed by relay lenses 15 and 16. After this, by means of a Savart plate 17, the paths of the lights $f_{A1U}$ and $f_{B2L}$ are combined into one (light 22) and, additionally, the paths for the lights $f_{A1L}$ and $f_{B2U}$ are separated away from this common light path. Then, the lights are passed through a polarization plate 18 having a polarization plane inclined by 45 degrees with respect to the sheet of the drawing and, after this, only the light 22 is condensed by a lens 19 and is detected by a sensor 20. As the sensor 20, a sensing element may be selected in consideration of responsibility to the beat frequency $|f_A - f_B|$. Thus, for a beat frequency of 1 MHz, for example, preferably an Avalanche photodiode (PAD) having good responsibility may be used.

Figure 5:
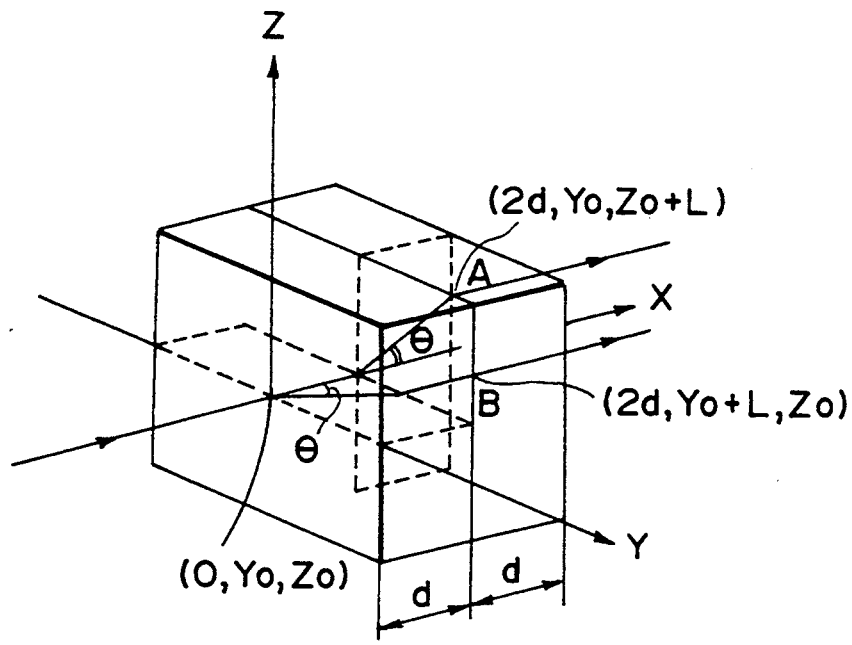
Figure 6:
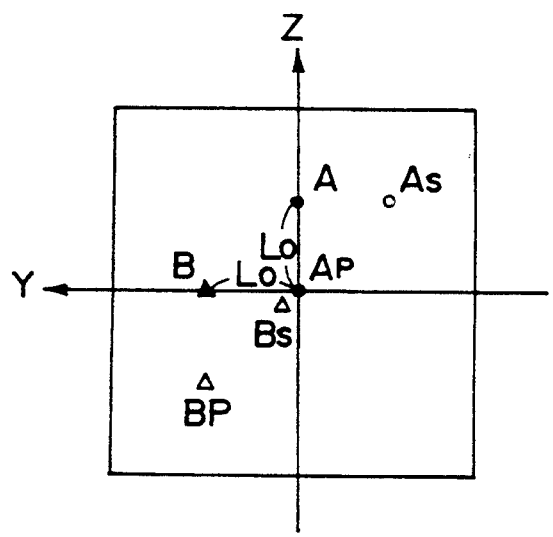

The Savart plate 17 will be explained in detail. As described hereinbefore, the Savart plate is used to combine the lights $f_{A1U}$ and $f_{B2L}$, diffracted by the wafer, with each other. A Savart plate is such as shown in FIG. 5, wherein two similar parallel flat plates each having a thickness d and an angle $\theta$ of a normal to the interface with respect to an optic axis ($\theta = 45$ deg. for a crystal and $\theta = 44.6$ deg. for calcite), are cemented to each other so that their principal sections (each being a plane including the optical axis and the direction of propagation) with respect to the perpendicularly incident light are orthogonal to each other. In the Savart plate, the ordinary ray (hereinafter "S wave") and the extraordinary ray (hereinafter "P wave") are different in the direction of advancement. The S wave in the first plate is transformed into a P wave in the second plate, while the P wave in the first plate is transformed into an S wave in the second plate. Thus, with either one of the first and second plates, each light is shifted once. If the quantity of shift is $L_0$, it is expressed as follows:

$$L_0 = (b^2 - a^2/2c^2)\sin 2\theta \cdot d \tag{7}$$

wherein $a = 1/n_e$ ($n_e$ is the refractive index for the extraordinary ray), $b = 1/n_0$ and $c = a^2\sin^2\theta + b^2\cos\theta$. The distance between the S wave and the P wave on the emission surface is $\sqrt{2} \cdot L_0$, such that the two lights emanating from the Savart plate are parallel lights spaced by a distance $\sqrt{2} \cdot L_0$. It is now assumed that a Savart plate is disposed in a coordinate system as depicted in FIG. 5 and that a light which is parallel to the X axis is incident on a point (0, $y_0$, $z_0$) on the Savart plate surface. The positions of the S wave and the P wave on the emission surface are (2d, $y_0$, $z_0 + L_0$) and (2d, $y_0 + L_0$, $z_0$), respectively. FIG. 6 is a front view of the light emission surface. If light A is perpendicularly incident on a point a (from behind the sheet of the drawing), the relative position of the S wave and the P wave shifts by $L_0$ in the Y-axis and Z-axis directions, respectively. If light B is incident on a point b which is spaced from the point a by $\sqrt{2} \cdot L_0$ and which is inclined by 45 deg. downwardly from the Y axis, then on the light emission surface the P wave of the light A and the S wave of the light B overlap one upon another. By using such a characteristic of a Savart plate, the diffraction lights from the wafer are superposed. That is, while in FIG. 5 the path is illustrated for the light inputted from the left-hand side and outputted to the right-hand side, similarly the inversion applies to the light inputted from the right-hand side and, in the structure of the optical system of the present embodiment, lights are inputted from the right-hand side and are combined and superposed at the emission side.

Referring back to FIG. 4, the advancement of lights in a portion adjacent to the Savart plate will be explained.

Two lights $f_{A1}$ and $f_{B2}$ are projected to the whole surfaces of two gratings on a wafer. The upper grating is denoted at U, and the lower grating is denoted at L. Here, diffraction light from the gratings includes four components which are now represented by $f_{A1U}$, $f_{B2U}$, $f_{A1L}$ and $f_{B2L}$. The suffix "U" means that the light bears positional information related to the upper grating U. Similarly, the suffix "L" means that the light bears positional information related to the lower grating L. At this time moment, the components $f_{A1U}$ and $f_{B2U}$ and the components $f_{A1L}$ and $f_{B2L}$ are on the same optical axes. The light of these four components goes through the relay lenses and enters into the Savart plate and, by the characteristic of the Savart plate as described hereinbefore, the components $f_{A1U}$ and $f_{B2L}$ are superposed one upon another.

Figure 7:
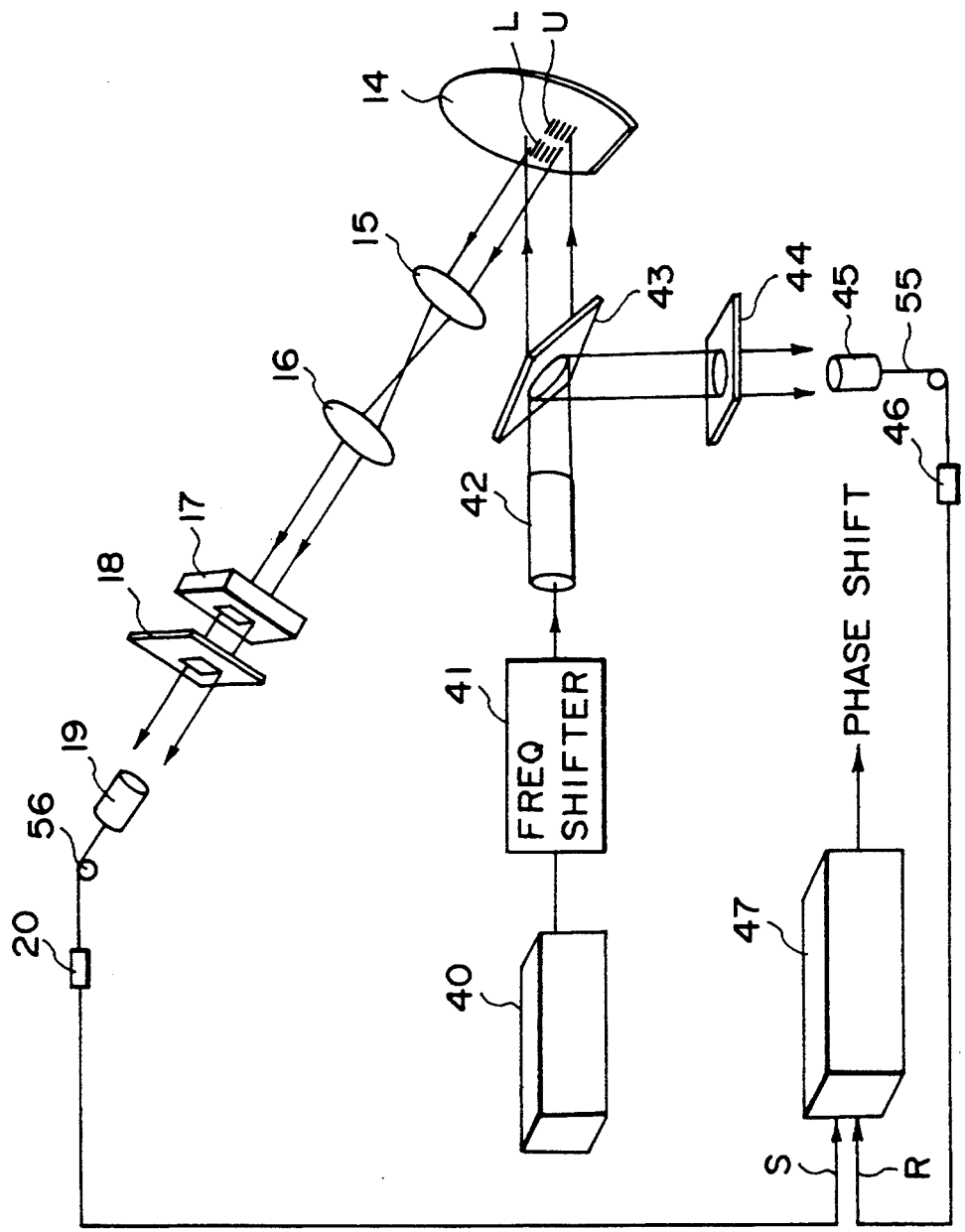

FIG. 7 shows a general structure of a measuring apparatus, including an illumination system, according to a first embodiment of the present invention. Like numerals as of those in FIG. 4 are assigned to corresponding elements.

In FIG. 7, denoted at 40 is a light source such as a laser, and denoted at 41 is a frequency shifter. When the light source 40 comprises a dual-frequency producing light source such as an axial Zeeman laser, for example, use of the frequency shifter 41 is not necessary. On that occasion, a phase plate such as a quarter waveplate may be disposed at the position of the shifter 41 in place thereof. Denoted at 42 is an optical system for beam diameter conversion, and denoted at 43 is a half mirror. The light from the light source 40 is directed to the frequency shifter 41, the optical system 42 and to the half mirror 43 and, after this, it illuminates the wafer 14 as shown in FIG. 4. Denoted at 44 is a polarization plate, at 45 is a condensing optical system, at 46 is a photosensor, at 47 is a lock-in amplifier, and at 55 and 56 are optical fibers (for example, single-mode fibers).

In the drawing, diffraction lights from two gratings U and L are detected by the sensor 20 in the manner described with reference to FIG. 4, and a signal represented by equation (5) is obtained.

Also, the light divided by the half mirror 43 is incident on the polarization plate 44 which has a polarization plane inclined by 45 deg. with respect to the oscillation plane of the P wave and S wave, and the emanating lights of two frequencies interfere with each other and, after passing through the condensing optical system 45 and the optical fiber 55, they are incident on the sensor 46. The sensor 46 detects such an interference light and produces a signal as represented by equation (6). The outputs S and R of the sensors 20 and 46 are applied to the lock-in amplifier 47, whereby a phase deviation signal corresponding to the relative positional deviation of the gratings is obtainable in the manner described hereinbefore. From the thus obtained signal and by means of a calculator (not shown), the quantity of relative positional deviation between the gratings, namely, the quantity of pattern misregistration or the quantity of alignment error is determined.

If there is no phase deviation between the grating patterns U and L, the wave fronts of the lights $f_{B2L}$ and $f_{A1U}$ do not involve relative phase shift due to the grating diffraction, and no phase difference is caused between the reference signal R and the signal S. If there is a phase deviation between the grating patterns U and L, the quantity of phase deviation in the output from the lock-in amplifier 47 is obtainable as a phase angle (actually, $\Delta T$) such as shown in FIG. 3. It is to be noted here that, in FIG. 7, the Savart plate 17 is so disposed that the diffraction light shifts in the direction of juxtaposition of the gratings L and U (i.e. the direction of a straight line of the straight grating).

Figure 8:
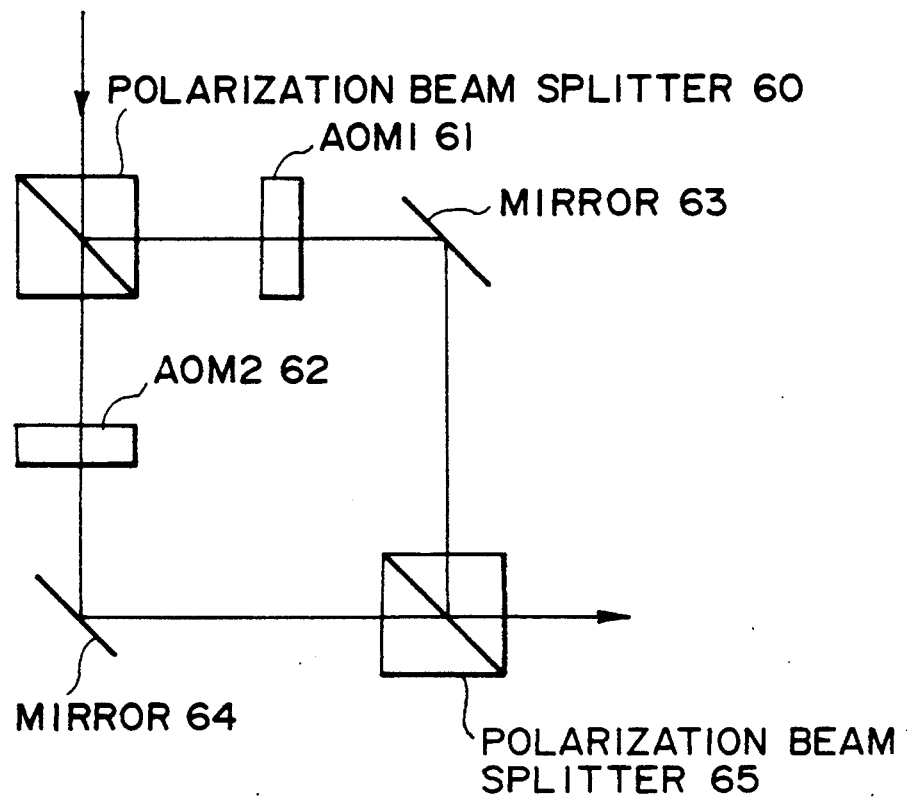

FIG. 8 shows an example of the phase shifter 41. Denoted in FIG. 8 at 60 is a polarization beam splitter, at 61 and 62 are acousto-optic modulators, at 63 and 64 are mirrors, and at 65 is another polarization beam splitter. Here, if, for example, the acousto-optical modulator 61 serves to effect acousto-optic modulation of 80 MHz, while the acousto-optic modulation 62 serves to effect acousto-optic modulation of 81 MHz, then a frequency difference of 1 MHz is provided between the two lights.

In accordance with the present embodiment, as described hereinbefore, by using the heterodyne interference measurement technique, the registration of patterns printed on a wafer can be evaluated very precisely and, additionally, it can be done automatically. As a result, it is possible to provide a printing evaluation device suited to the increasing degree of integration of semiconductor devices.

Next, the principle of a second embodiment and some other embodiments of the present invention will be explained.

Figure 9:
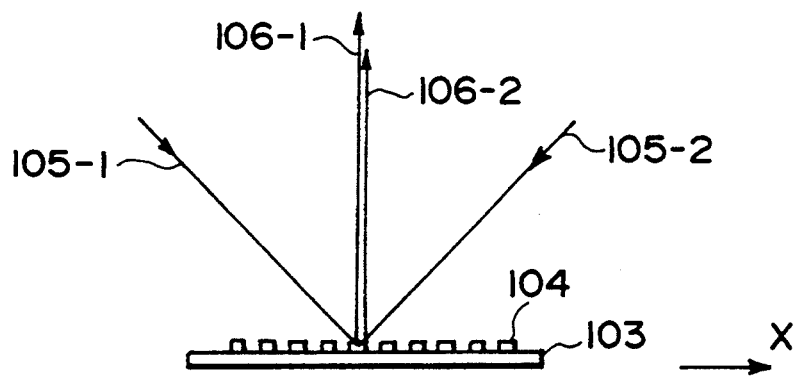

FIG. 9 shows a regular-pitch straight diffraction grating 104 (having straight grating patterns extending in a direction perpendicular to the sheet of the drawing) which is provided on a wafer 103 and on which laser lights 105-1 and 105-2 are incident as plane waves. The laser lights 105-1 and 105-2 have angles of incidence of the same absolute value but have slightly different frequencies. Here, with respect to the direction of advancement of zero-th order diffraction light, the left-hand side diffraction light will be referred to as "(+m)-th order diffraction light", while the right-hand side diffraction light will be referred to as "(−m)-th order diffraction light", where m is an integer. As illustrated, positive first order (+1st order) diffraction light of the light 105-1 and negative first order (−1st order) diffraction light of the light 105-2 are diffracted by the grating pattern 104 perpendicularly to the surface of the wafer 103. Here, it is well known that, if the grating 104 displaces in the X direction by an amount corresponding to one pitch (unit pitch) P, the wavefronts of the diffraction lights 106-1 and 106-2 produced as a result of impingement of the lights 105-1 and 105-2 against the diffraction grating 104 cause a phase shift of $2\pi$ (i.e. by one wave length). Thus, if the diffraction grating 104 moves in the X direction by $x_0$, a phase change of $\pm 2 m\pi x_0/P$ is added to the diffraction light, where m is the order of the diffraction light. This is the same as having been described with reference to the first embodiment. Embodiments to be described later provide a pattern printing misregistration detecting method and device, separate from the first embodiment using this principle.

Now, as shown in FIG. 10, two adjacent regular-pitch straight gratings placed on the same plane will be considered. Here, the two gratings have the same pitch P', and there are a deviation ($\Delta x = x'_B - x'_A$) in the direction of an arrow (X direction) between these gratings. One of the gratings will be referred to as a grating A', and the other will be referred to as a grating B'. Characters $x'_A$ and $x'_B$ denote deviations in the X direction of the gratings A' and B', respectively, from the same reference position.

Here, the frequencies $\omega_{f1}$ and $\omega_{f2}$ are slightly different from each other, and the initial phases are $\phi_{0f1}$ and $\phi_{0f2}$, respectively. The complex amplitudes $U_{F1}$ and $U_{f2}$ of two lights 109 and 110 are given by:

$$U_{f1} = A_0 \exp\{i(\omega_{f1} t + \phi_{0f1})\} \quad (8)$$

$$U_{f2} = B_0 \exp\{i(\omega_{f2} t + \phi_{0f2})\} \quad (9)$$

These two lights 109 and 110 are projected to the whole surfaces of the two gratings. For example, the light 109 is projected from the left-hand side while the light 110 is projected from the right-hand side, at the angles of incidence of the same absolute value. Here, if positive first order diffraction lights of the light 109 by the gratings A' and B' are denoted by 111 and 112 while negative first order diffraction lights of the light 110 by the gratings A and B are denoted by 113 and 114, then, the complex amplitudes of the lights 111, 113, 112 and 114, namely, $U'_{Af1}(+1)$, $U'_{Af2}(-1)$, $U'_{Bf1}(+1)$ and $U'_{Bf2}(-1)$, are expressed as follows:

$$U'_{Af1}(+1) = A_{f1} \exp\{i(\omega_{f1} t + \phi_{0f1} + \phi_{A'})\} \quad (10)$$

$$U'_{Af2}(-1) = A_{f2} \exp\{i(\omega_{f2} t + \phi_{0f2} + \phi_{A'})\} \quad (11)$$

$$U'_{Bf1}(+1) = B_{f1} \exp\{i(\omega_{f1} t + \phi_{0f1} + \phi_{B'})\} \quad (12)$$

$$U'_{Bf2}(-1) = B_{f2} \exp\{i(\omega_{f2} t + \phi_{0f2} + \phi_{B'})\} \quad (13)$$

wherein $\phi_{A'}=2\pi X_{A'}/P$ and $\phi_{B'}=2\pi X_{B'}/P$ and they are deviations in the X direction of the gratings A' and B' as represented in terms of phase quantity. When the diffraction lights 111 and 113 from the grating A' and the diffraction lights 112 and 114 from the grating B' are caused to interfere with each other, the respective interference light intensity changes $U_A$ and $U_B$ are such as follows:

$$U_A = |U_{Af1}(+1) + U_{Af2}(-1)|^2 \qquad (14)$$
$$= A_{f1}^2 + A_{f2}^2 + 2A_{f1}A_{f2}\cos\{2\pi(f_2 - f_1)t + (\phi_{0f2} - \phi_{0f1}) - 2\phi_{A'}\}$$

$$U_B = |U_{Bf1}(+1) + Y_{Bf2}(-1)|^2 \qquad (15)$$
$$= B_{f1}^2 + B_{f2}^2 + 2B_{f1}B_{f2}\cos\{2\pi(f_2 - f_1)t + (\phi_{0f2} - \phi_{0f1}) - 2\phi_{B'}\}$$

wherein $f_1=\omega_{f1}/2\pi$, $f_2=\omega_{f2}/2\pi$, $A_{f1}^2+A_{f2}^2$ and $B_{f1}^2+B_{f2}^2$ are DC components, and $2A_{f1}A_{f2}$ and $2B_{f1}B_{f2}$ are amplitudes. Equations (14) and (15) are such that the signal having a beat frequency component of $f_2-f_1$ is phase-modulated with time by an amount corresponding to the respective deviations $\phi_{A'}$ and $\phi_{B'}$ of the gratings A' and B' and the initial phase deviation $\phi_{0f2}-\phi_{0f1}$. Therefore, by taking one of the signals represented by equations (14) and (15) as a reference signal while taking the other as a measured signal, and by detecting a time difference between them, the initial phase of the light can be erased and high-precision phase detection $\Delta\phi=\phi_{B'}-\phi_{A'}=(2\pi/P')\Delta x$ can be attained as heterodyne interference measurement. Since, as described hereinbefore, in the heterodyne interference method, a phase difference between two signals is detected with respect to time, any difference in the DC components between these signals or any change in amplitude does not affect the measurement. If, as shown in FIG. 11, there is a deviation $\Delta T$ in time between a reference signal 115 and a measured signal 116, by detecting the deviation $\Delta T$ precisely with the use of a lock-in amplifier, for example, the phase difference can be measured with high precision.

Since the phase difference detected in the manner described above is equivalent to the phase difference $\Delta\phi$ which represents the relative deviation of the gratings, the relative deviation of the gratings is determined by $P'\Delta\phi//2\pi$.

Therefore, by detecting misregistration between a grating pattern printed a first time and a grating pattern printed a second time, in accordance with the principle described above and in a similar manner to the first embodiment, it is possible to detect the alignment precision of a semiconductor exposure apparatus or misregistration between actual device patterns formed by the first time printing and the second time printing, like the first embodiment.

Figure 12:
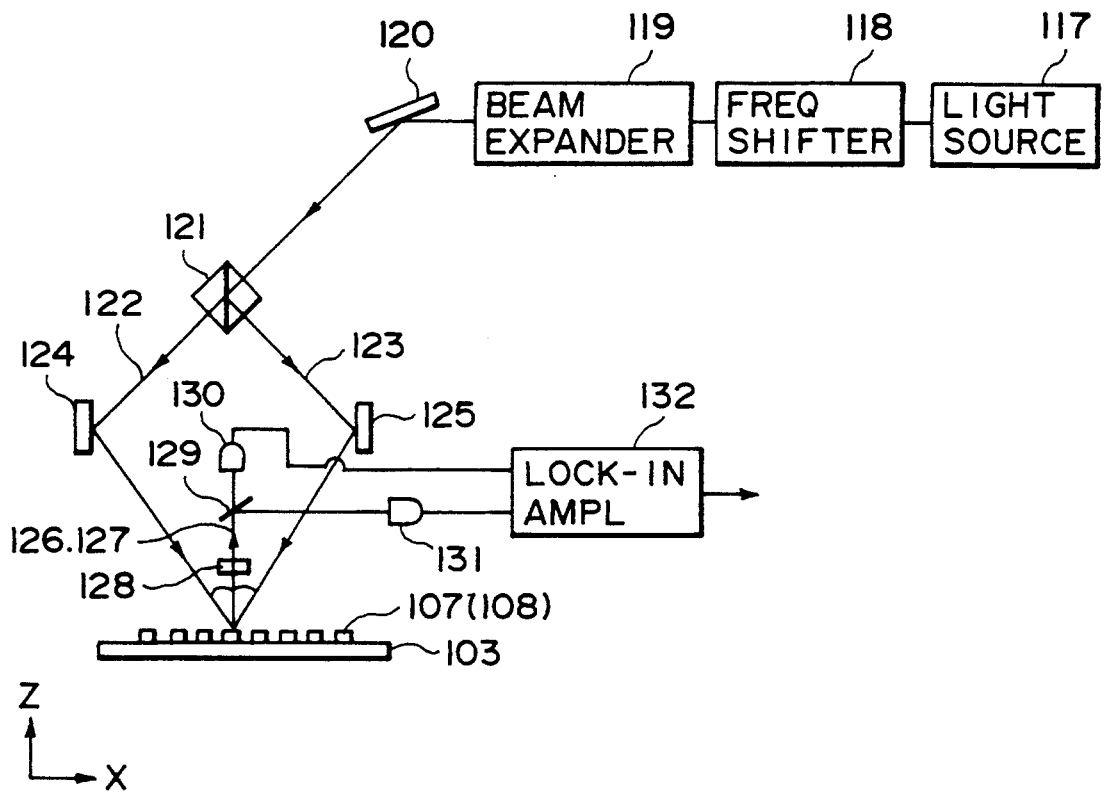
Figure 13:
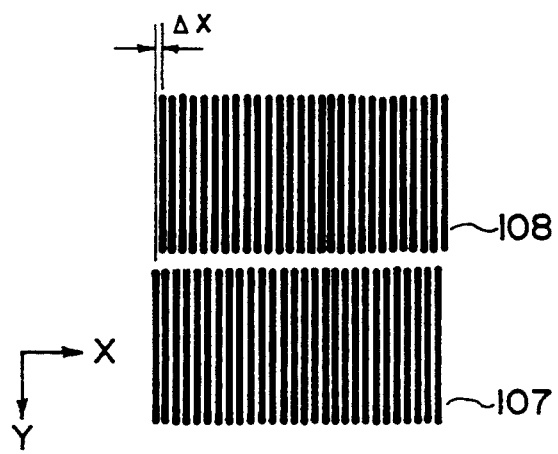

FIG. 12 shows a general structure of a measuring apparatus according to a second embodiment of the present invention. Light emanating from a light source 117 such as a laser is transformed by a frequency shifter 118 into two lights $f_{A1}$ and $f_{B2}$ having orthogonally intersecting polarization planes and having slightly different frequencies. Here, the suffix "1" means P-polarized light while the suffix "2" means S-polarized light. The two lights $f_{A1}$ and $f_{B2}$ are on a common light path. Beam expander 119 restricts the beam diameter, and a mirror 120 changes the advancing direction of the light. The lights $f_{A1}$ and $f_{B2}$ are incident on a polarization beam splitter 121 and are separated into two directions, in dependence upon the difference in polarization plane. Here, the light $f_{A1}$ is directed as light 122, while the light $f_{B2}$ is directed as light 123. The light separated into two directions are then reflected by mirrors 124 and 125, respectively, and they impinge on the whole surfaces of gratings 107 and 108 on a wafer 103, at the angles of incidence of the same absolute value. FIG. 13 shows the gratings 107 and 108, as viewed in the Z-axis direction in FIG. 12.

FIG. 14 is an enlarged view of an optical system of a portion in which diffraction and interference of input light occurs. Lights 122 and 123 having the same angle with respect to a normal to the wafer 103 surface are inputted from the left-hand side and the right-hand side to irradiate the gratings 107 and 108. Here, the lights 122 and 123 have slightly different frequencies, and their polarization planes intersect perpendicularly with each other. In FIG. 14, positive first order (+1st order) diffraction light 126-1 produced by the light 122 inputted to the grating from the left-hand side, and negative first order (−1st order) diffraction light 126-2 produced by the light 123 inputted to the grating 107 from the right-hand side, pass through a Glan-Thompson prism 128, whereby they are superposed one upon another and their wavefronts are registered in the polarization plane. Thus, they interfere with each other. Similarly, positive first order diffraction light 127-1 of the light 122 and negative first order diffraction light 127-2 of the light 123, from the grating 108, interfere with each other. Each interference light $S_1$ or $S_2$ includes a phase term representing a deviation with respect to the initial phase of the grating 107 or 108, and, when the interference signals are expressed in an equation, the results are such as equations (14) and (15).

More specifically, equation (14) represents a signal resulting from the interference of the light 126-1 with the light 126-2, while equation (15) represents a signal resulting from the interference of the light 127-1 with the light 127-2, and $2\phi_{A'}$ and $2\phi_{B'}$ are the phase terms representing the deviations. The interference lights $S_1$ and $S_2$ passed through the Glan-Thompson prism 128 and corresponding to the gratings 107 and 108, respectively, are deviated in accordance with the disposition of the gratings, and they are spatially separated by an edge mirror 129 into two directions. After this, each interference light is converted into an electric signal by means of a photosensor 130 or 131 which comprises a photoelectric converter such as an Avalanche photodiode, for example, and the signal is applied to a lock-in amplifier 132.

Figure 15:
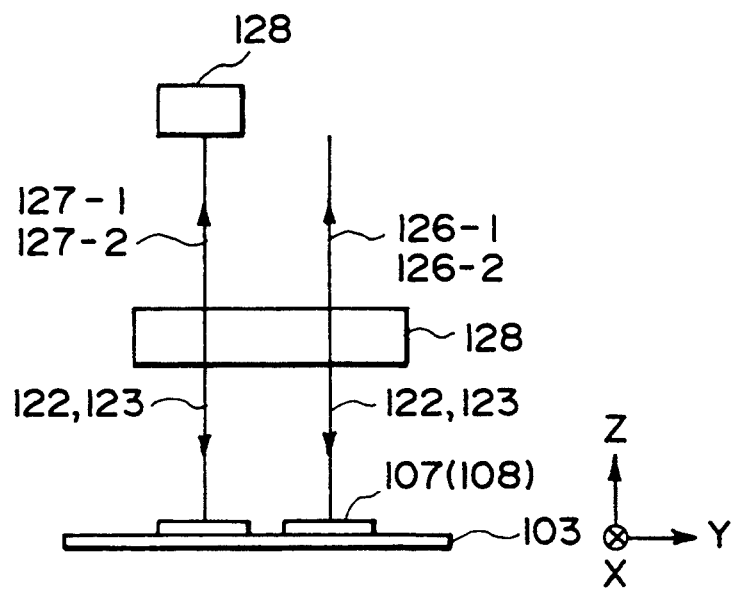

FIG. 15 shows the optical system of FIG. 14 as viewed in the X-axis direction. The input light and the diffraction light coincide along a straight line.

Here, if the pitch of each of the gratings 107 and 108 is 2 microns and the wavelength $\lambda$ of the light emanating from the light source 117 is $\lambda=0.6328$ micron, then, in order to assure that positive and negative first-order diffraction lights 126-1, 126-2, 127-1 and 127-2 are diffracted perpendicularly to and upwardly from the wafer 103, the angles $(\theta_{\pm 1})$ of incidence of the lights 122 and 123 to the gratings 107 and 108 should satisfy $\theta_{\pm 1}=\sin^{-1}(0.6328/2)=18.4$ deg., this being determined by the following relation:

$$\theta_{\pm 1}=\sin(m\lambda/P) \qquad (16)$$

wherein m is the order of diffraction light.

If during measurement the phase difference is detected with λ/1000, the positional deviation of the grating pattern corresponds to 0.0002 micron.

The frequency shifter 118 may be such as shown in FIG. 8, for example.

In the second embodiment, positive and negative first order diffraction lights from the gratings 107 and 108 are used to detect the deviation. However, the mirrors 124 and 125 in FIG. 12 may be displaced so that higher-order diffraction lights (±m-th orders wherein m=2, 3, 4, . . .) are diffracted perpendicular to and upwardly from the wafer 103, and these diffraction lights may be used for the measurement.

When higher-order diffraction lights are used for measurement, the phase quantity representing the deviation of the grating in the X direction can be detected with higher sensitivity. For example, if ±m-th order diffraction light is used, the measurement can be made with a sensitivity m times higher than that as attainable with the positive and negative first order diffraction lights.

Here, if, as the second embodiment, the pitch P of each of the gratings 107 and 108 is 2 microns and the wavelength λ of the light source 17 is 0.6328 micron, then, in order that positive and negative second order diffraction lights are diffracted perpendicularly to and upwardly from the wafer 103, from equation (16), the incidence angle $\theta_{\pm2}$ should be set as follows:

$$\theta_{\pm2}=\sin(2\times0.6388/2)=39.3 \text{ deg.} \quad (17)$$

Similarly, in a case of ±3-rd order diffraction lights, it should be set as follows:

$$\theta_{\pm3}=\sin(2\times0.6328/2)=71.7 \text{ deg.} \quad (18)$$

Also, when ±m-th order diffraction lights are used for measurement, the phase terms $\phi'_{Am}$ and $\phi'_{Bm}$ which correspond to $\phi_{A'}$ and $\phi_{B'}$ in equations (10) to (13), are expressed as follows:

$$\phi'_{Am}=2m\pi X_{A'}/P \quad (19)$$

$$\phi'_{Bm}=2m\pi X_{B'}/P \quad (20)$$

Therefore, the deviation of the gratings 107 and 108 can be expressed in terms of phase quantity, such as follows:

$$(2\phi'_{Bm}-\phi'_{Am})=(4m\pi/P)(X_{B'}-X_{A'}) \quad (21)$$

Figure 16:
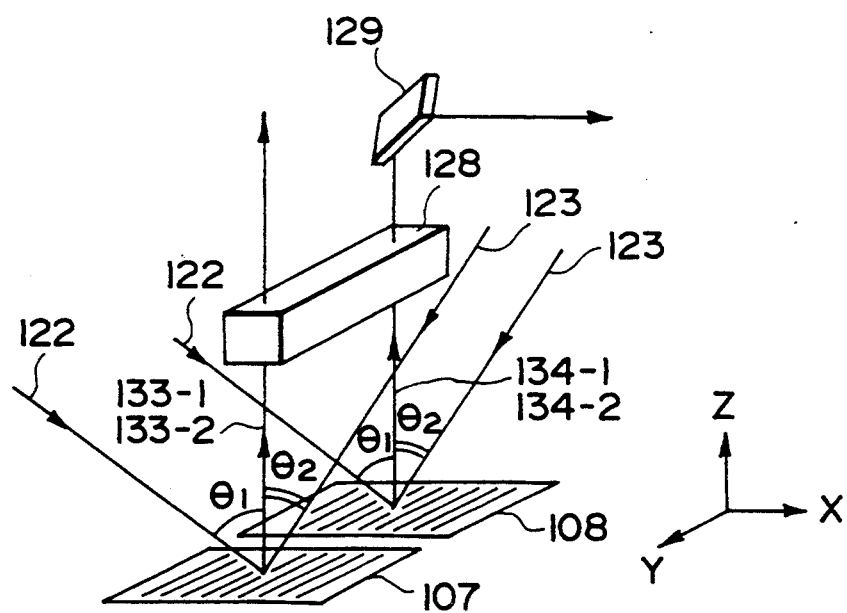
FIG. 16 is a schematic view of a third embodiment of the present invention.

FIG. 16 shows a third embodiment of the present invention, wherein like numerals as in the preceding embodiments are assigned to corresponding elements.

In FIG. 16, while in the second embodiment the light 122 is inputted from the left-hand side while the light 123 is inputted from the right-hand side at the same incidence angle ($\theta_1=\theta_2$ in FIG. 16) to irradiate the whole surfaces of the gratings 107 and 108 and those diffraction lights of the orders of the same absolute value (e.g. positive m-th order and negative m-th order, where m=1, 2, 3, . . .) are caused to interfere with each other and are used for the measurement, in the present embodiment the angles of incidence of the lights 122 and 123 to the gratings 107 and 108 are made adjustable by changing the positions of the mirrors 124 and 125, such that those diffraction lights of the orders of different absolute values (e.g. positive m-th order and negative n-th order, where m=1, 2, 3, . . . and n=1, 2, 3, . . . , wherein |m|≃|n|) can be caused to interfere with each other, to thereby detect the movement, as desired. The remaining portion of the structure is essentially the same as the second embodiment. Illustrated in FIG. 16 is an example wherein the lights 122 and 123 are incident on the gratings 107 and 108, respectively, with the angles $\theta_1$ and $\theta_2$ wherein $|\theta_1|\simeq|\theta_2|$. Here, (+m)-th order diffraction lights of the light 122 from the gratings 107 and 108 are denoted by 133-1 and 134-1. Also, (−n)-th order diffraction lights of the light 123 from the gratings 107 and 108 are denoted by 133-2 and 134-2. If the phase terms corresponding to $\phi_{A'}$ and $\phi_{B'}$ in equations (10) and (11) or in equations (12) and (13), are denoted by $\phi_{Amn}$ and $\phi_{Bnm}$, then they are given by:

$$\phi_{Amn}=(2\pi X_{A'}/P)(n-m) \quad (22)$$

$$\phi_{Bmn}=(2\pi X_{B'}/P)(n-m) \quad (23)$$

Figure 17:
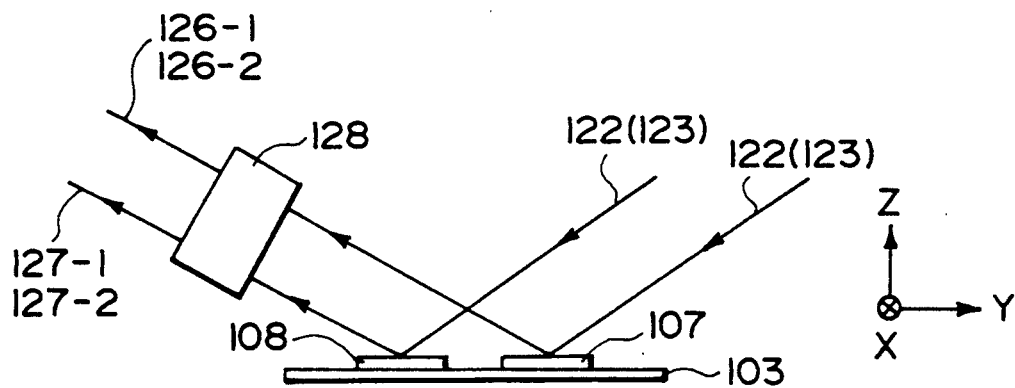
Figure 18:
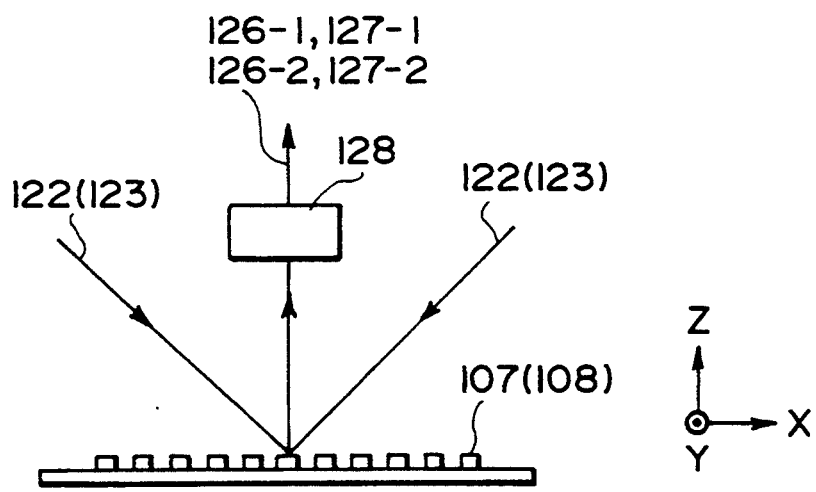

Next, a fourth embodiment of the present invention will be explained. In the second embodiment, the paths of the input lights 122 and 123 define an angle of 90 degrees with respect to the direction in which the grating lines of the gratings 107 and 108 extend (see FIGS. 14 and 15). In the present embodiment, the input light is incident at an angle other than 90 degrees with respect to the grating. The remaining structure and method are similar to the second embodiment. FIGS. 17, 18 and 19 illustrate the relationship among the input lights 122 and 123 and the diffraction lights 126-1, 126-2, 127-1 and 127-2, as viewed in respective directions. Here, considering the light path on the plane of projection to a sectional plane (X-Z plane) which contains a normal to the wafer 103 surface and which is orthogonal to the direction of the grating line, the input lights 122 and 123 are incident from the opposite sides of a plane (which coincides with the Z axis in this Figure) which contains the normal and is parallel to the grating line.

FIGS. 20 and 21 show a grating portion of a fifth embodiment of the present invention. In the first to fourth embodiments, the gratings U and L (107 and 108) to be used for the measurement are so interrelated that, if superposedly printed actual device patterns have no misregistration, there is no positional deviation (offset) of grating patterns with respect to the positional deviation detecting direction (X direction in these examples). As compared therewith, in the present embodiment, the gratings 107 and 108 are disposed with a predetermined offset X therebetween. By subtracting the quantity of this offset from a measured value, obtained as a result of the detection, deviation Δx can be measured in accordance with the structure and method of any one of the first to fourth embodiments.

FIG. 20 shows an example wherein an offset is set in the positional deviation detecting direction and, additionally, a spacing is defined in a direction perpendicular to that direction. FIG. 21 shows an example wherein only an offset is set in the positional deviation detecting direction, and no spacing is defined in a direction perpendicular to that direction.

Figure 22:
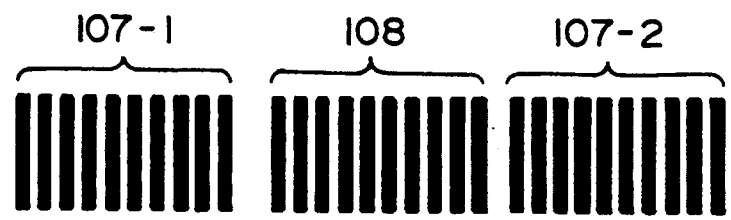
FIGS. 22 and 23 are schematic views, respectively, of a sixth embodiment of the present invention.
Figure 23:
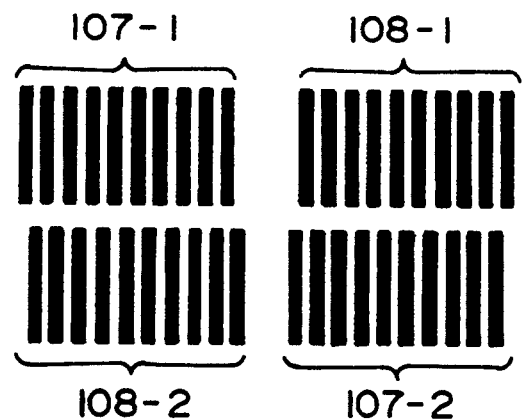

FIGS. 22 and 23 show a grating portion according to a sixth embodiment of the present invention. In this embodiment, at least one of two gratings of the preceding embodiment is divided. In FIG. 22, gratings 107-1 and 107-2 are formed by splitting an originally integral or continuous single grating into two and by drawing the split parts of the grating with an intermediate blank.

In this intermediate blank, a grating 108 is drawn. The gratings 107-1 and 107-2 constitute one grating group, and any positional deviation between this grating group and the grating 108 is detected. For the measurement, light is projected to the grating group as a while as in the case of the grating of any one of the first to fourth embodiments, and the light from the grating group as a whole is received by a corresponding one of plural photoreceptors, in a similar manner as the light from one grating in any one of the first to fourth embodiments. A resultant signal is then processed in a similar manner as the signal produced by the diffraction light from one grating in any one of the first to fourth embodiments. The remaining portion of the measuring method and device structure is essentially the same as any one of the preceding embodiments.

FIG. 23 shows an example wherein both of two gratings in the first to fourth embodiments are divided. In FIG. 23, gratings 107-1, 107-2 and gratings 108-1 and 108-2 are provided by dividing respective gratings, and any positional deviation between a first grating group comprising the gratings 107-1 and 107-2 and a second grating group comprising the gratings 108-1 and 108-2, is detected. To each grating group, light is projected in a similar manner as a corresponding grating in any one of the preceding embodiments, and light from each grating group is received by one or or plural photoreceptors in a similar manner as the reception of the diffraction light from the corresponding one grating in any one of the preceding embodiments. By processing the signal from each grating group in a similar manner as the signal produced by diffraction light from a corresponding one grating in any one of the preceding embodiments, the deviation can be measured in a similar manner.

Figure 24:
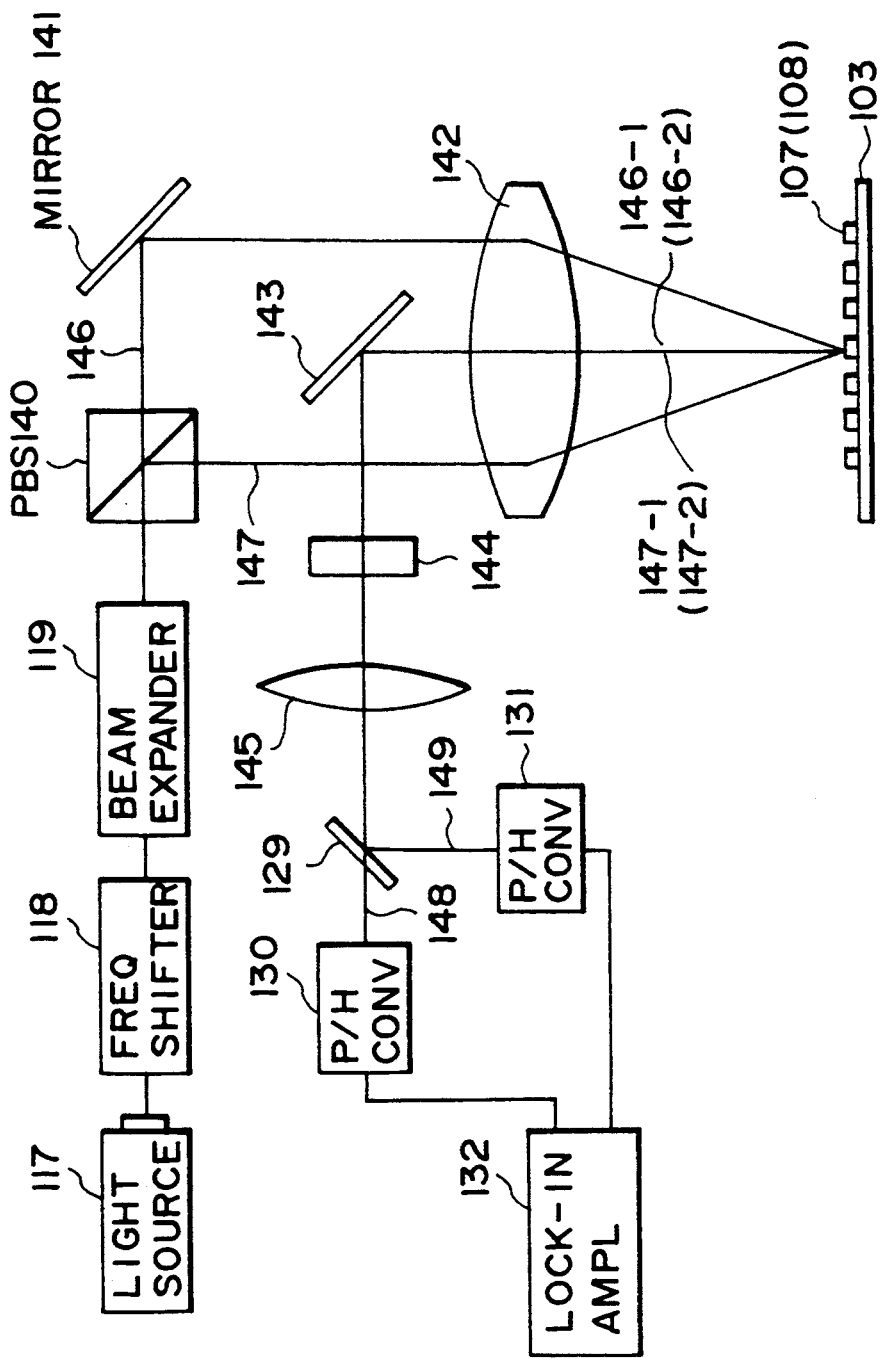
FIG. 24 is a schematic view of a seventh embodiment of the present invention.

FIG. 24 shows a measuring apparatus according to a seventh embodiment of the present invention. In this embodiment, the optical arrangement is modified as compared with the second embodiment. Light emanating from a light source 117 goes through a frequency shifter 118, by which it is transformed into two lights having slightly different frequencies and having their polarization planes intersecting orthogonally with each other. These lights are then received by a beam expander 119, whereby the beam diameter is converted into a specified size. After this, the two lights are separated by a polarization beam splitter 140 into two directions depending upon a difference in the polarization plane. Here, the light which is P-polarized and which has an angular frequency $\omega_1$ is denoted by 146, while the light which is S-polarized and which has an angular frequency $\omega_2$ is denoted by 147. The light 146 passed through the interface of the polarization beam splitter 140 is deflected by a mirror 141 and, by means of an objective lens 142, it is projected to gratings 107 and 108 on a wafer 103, with a predetermined angle of incidence being retained. The manner of incidence of each light upon each grating, at this time, is the same as the second embodiment. It is to be noted here that the objective lens 142 is so designed that the beam waist portion of the light from the light source 117 rides on the gratings 107 and 108 of the wafer 103. Similarly, the light 147 reflected by the interface of the polarization beam splitter 140 is projected by the objective lens 142 upon the gratings 107 and 108 on the wafer 103. The lights 146 and 147 are thus projected to the gratings 107 and 108. Negative first order diffraction light of the light 146 from the grating 107 will be referred to as light 146-1, while negative first order diffraction light of the light 146 from the grating 108 will be referred to as light 146-2. Similarly, positive first order diffraction light of the light 147 from the grating 107 will be referred to as light 147-1, while positive first order diffraction light of the light 147 from the grating 108 will be referred to as light 147-2. These four lights are deflected by a mirror 143 and, by means of a polarizer 144, the lights 146-1 and 147-1 are caused to interfere with each other while the lights 146-2 and 147-2 are caused to interfere with each other. The light produced as a result of the interference of the lights 146-1 and 147-1 is denoted by 148, while the light produced as a result of the interference of the lights 146-2 and 147-2 is denoted by 149. These two lights are passed through a relay lens 145 and, by means of an edge mirror 129, they are separated from each other such that the light 148 is incident on a photoelectric converter 130 while the light 149 is incident on another photoelectric converter 131. At this time, as regards the wavefront of light upon the light receiving surface of each photoelectric converter, the beam waist portion on the wafer 103 surface is imaged by the relay lens 145. Signals from the photoelectric converters 130 and 131 are applied to a lock-in amplifier 132 and, in a similar manner as the second embodiment, a phase difference between the lights 148 and 149 is detected.

FIGS. 25–27 show a grating portion, for explaining an eighth embodiment of the present invention. FIG. 25 shows a grating pattern 148 on a first resist to be printed at the first time on a resist (first layer) on a wafer. FIG. 26 shows a grating pattern 249 on a second resist to be printed at the second time upon a resist (second layer) applied onto the first layer of the wafer after development thereof. FIG. 27 shows the wafer having the grating patterns 148 and 149 printed thereon. The grating pattern 148 is printed on the wafer as a first layer, and this pattern is denoted at a. The pattern a consists of a pattern $a_1$ and a pattern $a_2$. Then, the grating pattern 149 is printed on the wafer as a second layer, and this pattern is denoted at b. These two grating patterns a and b are combined with each other, such that a grating pattern group as shown in FIG. 27 is formed on the wafer. Here, the upper half of the grating pattern group is depicted as a region 154, while the lower half is depicted as a region 155. Further, the region 154 is divided into two, and the left-hand half is depicted as a region 150 (pattern $a_2$ portion), while the right-hand half is depicted as a region 152 (pattern b portion). Similarly, the region 155 is divided into two, and the left-hand half is depicted as a region 151 (pattern $a_2$ portion) while the right-hand half is depicted as a region 153 (pattern $a_1$ portion). To such a grating pattern group, light is projected in a predetermined direction within a plane which contains a normal to the wafer surface and which has an angle of 90 deg. with respect to the direction in which the grating line is drawn. More specifically, light having an angular frequency $\omega_1$ and an initial phase $\phi_{01}$ is projected to the region 154, while light having an angular frequency $\omega_2$ and an initial phase $\phi_{02}$ is projected to the region 155. The complex amplitudes of first order diffraction lights as obtainable from these regions can be expressed by the following equations:

Region 150: $u_1 = A \cdot \exp(\omega_1 t + \phi_{01} + \phi_a)$ (24)

Region 151: $u_2 = B \cdot \exp(\omega_2 t + \phi_{02} + \phi_a)$ (25)

Region 152: $u_3 = C \cdot \exp(\omega_1 t + \phi_{01} + \phi_b)$ (26)

Region 153: $u_5 = D \cdot \exp(\omega_2 t + \phi_{02} + \phi_3)$ (27)

wherein $\phi_a = 2\pi x_a/P$ and $\phi_b = 2\pi x_b/P$ and wherein $x_a$ and $x_b$ are deviations in the X direction of the grating patterns a and b, respectively, from the same reference position. By superposing those lights, of the four diffraction lights, as represented by equations (24) and (25), to cause interference therebetween, the resultant is expressed by the following equation and this signal provides the reference signal in the measurement:

$$|u_1 + u_2|^2 = A^2 + B^2 + 2AB\cos\{(\omega_2 - \omega_1)t + (\phi_{02} - \phi_{01})\} \quad (28)$$

Also, by superposing the lights represented by equations (26) and (27), to cause interference therebetween, the resultant can be expressed by the following equation, this signal providing an object signal containing a phase term that represents relative positional deviation between the grating pattern in the region 152 and the grating pattern in the region 153, that is:

$$|u_3 + u_4|^2 = C^2 + D^2 + 2CD\cos\{(\omega_2 - \omega_1)t + (\phi_{02} - \phi_{01}) + (\phi_a - \phi_b)\} \quad (28)$$

By applying the signals expressed by equations (28) and (29) to the lock-in amplifier, any phase difference between the two signals, that is, the deviation $\phi_a - \phi_b$ of the gratings, can be measured in a similar manner as in the preceding embodiment. As regards the structure of the apparatus, in the apparatus of the second embodiment shown in FIG. 12, the optical arrangement may be so modified that two lights emanating from the polarization beam splitter 121 are incident on the regions 154 and 155 at the same angle, and that first order diffraction lights from the regions 150 and 151 are superposed one upon another to cause interference and then are incident on the photodetector 130 while, on the other hand, first order diffraction lights from the regions 152 and 153 are superposed one upon another to cause interference of them and are incident on the detector 131.

While in the measuring method of this embodiment the input lights are projected to the wafer from one side, the input lights may be projected to the wafer from the opposite sides as in the second embodiment. On that occasion, it is now assumed that light having an angular frequency $\omega_1$ and an initial phase $\phi_{01}$ is projected to the region 154 from the left-hand side, while light having an angular frequency $\omega_2$ and an initial phase $\phi_{02}$ is projected to the region 155 from the right-hand side. Here, diffraction lights obtainable from these regions can be expressed such as follows.

Positive first order diffraction light from region 150:

$$u_1' = A \cdot \exp(\omega_1 t + \phi_{01} + \phi_a) \quad (30)$$

Negative first order diffraction light from region 151:

$$u_2' = B \cdot \exp(\omega_2 t + \phi_{02} + \phi_a) \quad (31)$$

Positive first order diffraction light from region 152:

$$u_3' = C \cdot \exp(\omega_1 t + \phi_{01} + \phi_b) \quad (32)$$

Negative first order diffraction light from region 153:

$$u_4' = D \cdot \exp(\omega_2 t + \phi_{02} + \phi_a) \quad (33)$$

When the lights as expressed by equations (30) and (31) are superposed to cause interference, the resultant is expressed as follows, this being a reference signal:

$$|u_1' + u_2'|^2 = A^2 + B^2 + 2AB\cos\{(\omega_2 - \omega_1)t + (\phi_{02} - \phi_{01}) - 2\phi_a\} \quad (34)$$

Also, when the lights as expressed by equations (32) and (33) are superposed to cause interference, the resultant is such as follows, this being an object signal:

$$u_3'^2 + u_4'^2 = C^2 + D^2 + 2CD\cos\{(\omega_2 - \omega_1)t + (\phi_{02} - \phi_{01}) + (\phi_a - \phi_b)\} \quad (35)$$

By applying the signals of equations (34) and (35) to a lock-in amplifier, any phase difference between the two signals, that is, the deviation $\phi_a - \phi_b$ of the gratings can be measured.

Figure 28:
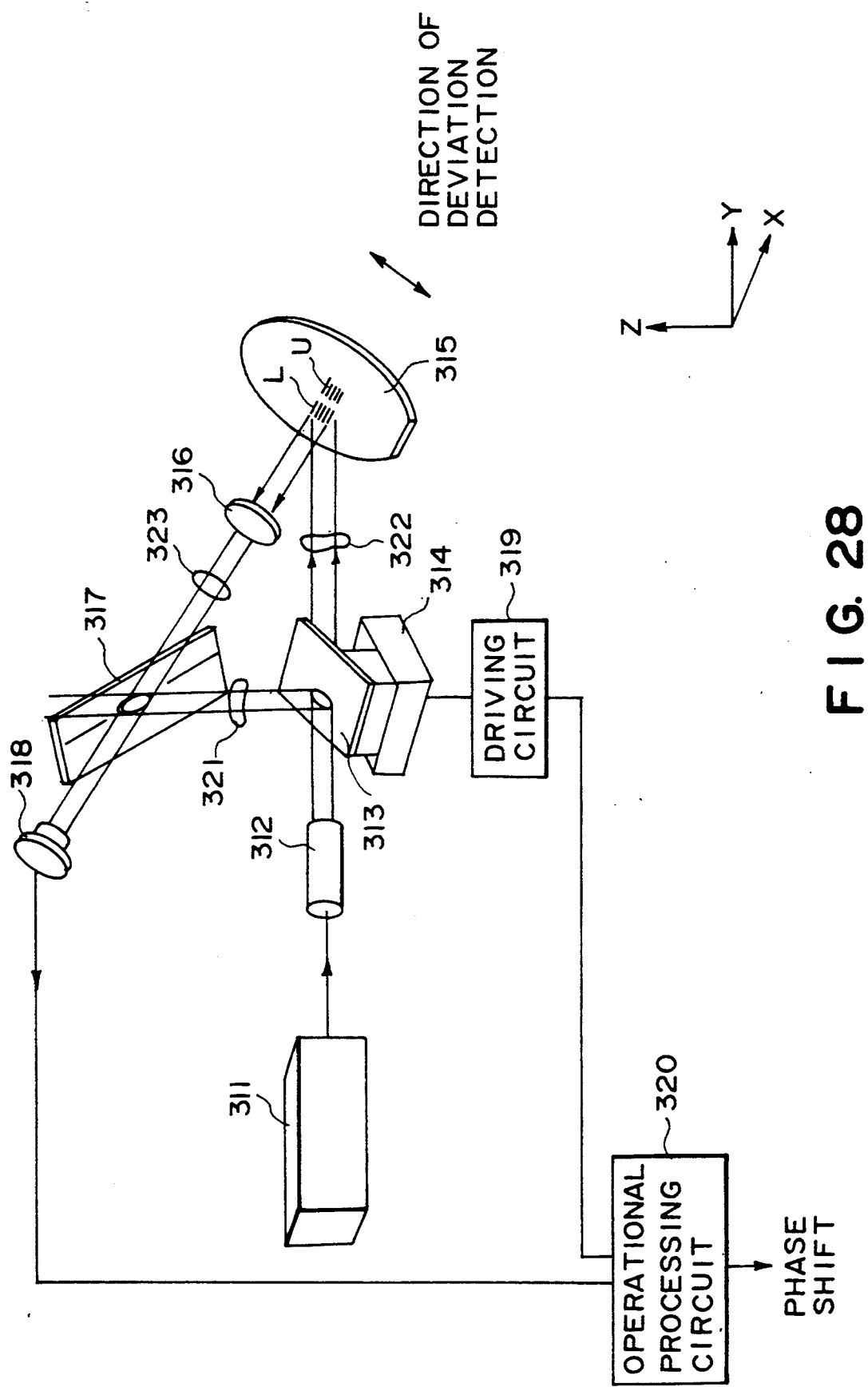

FIG. 28 shows a ninth embodiment of the present invention. Denoted in FIG. 28 at 311 is a high-coherency light source such as a laser, for example; at 312 is a beam expander; at 313 is a half mirror; and at 314 is a moving mechanism which comprises a piezoelectric device, for example, for moving the half mirror 313 in the Z-axis direction. Denoted at 315 is a substrate (wafer), to be examined, having patterns L and U printed thereon. Denoted at 316 is a lens; at 317 is a half mirror; at 318 is a photosensor such as a CCD, for example; and at 319 is a driving circuit for the moving mechanism 314. Denoted at 320 is an operational processing system such as a computer, for example, which receives a signal from the photosensor 318 and a signal from the driving circuit 319, representing the magnitude of drive applied to the moving mechanism 314, to calculate deviation of the patterns L and U.

The light emanating from the laser 311 is transformed by the lens 312 into a plane wave light of a predetermined size. After this, it is divided by the half mirror 313 into a reference wave 321 and a wave 322 which is to be projected onto the wafer 315. As the plane wave 322 is projected on the deviation detecting patterns L and U on the wafer 315 surface, since these patterns are provided by straight diffraction grating patterns, first order diffraction lights (plane waves) are produced. These diffraction lights are directed through the lens 316 and the half mirror 317 and are superposed with the reference wave 321, whereby interference is produced. The interfering wave is then photoelectrically converted by the photosensor 318 which comprises a two-dimensional area sensor such as a CCD. The lens 316 serves to place the patterns L and U and the sensor 318 in an optically conjugate relationship.

The interference fringe as obtainable on the photosensor 318 surface will be explained in detail, with reference to FIGS. 29-34.

In FIGS. 29 and 30, straight grating patterns each defined by a level difference are formed on a wafer. More specifically, each of the hatched regions in FIGS. 29 and 30 has a level difference as compared with the surrounding region, which level difference has been defined in a resist or a semiconductor process material applied onto the wafer. When the grating pitch is P and when a plane wave is projected obliquely to the wafer 315 as shown in FIG. 28 such that first diffraction light is diffracted in a direction perpendicular to the wafer surface, if the wavelength of the light is $\lambda$ and the angle of incidence of the light is $\theta$, then the following relation is established:

$$P\sin\theta = \lambda \tag{36}$$

FIGS. 31–34 each schematically illustrates the interference fringe as obtainable on the photosensor 318 surface. FIGS. 31 and 32 each shows an intensity distribution on the sensor as the reference light 321 and the diffraction light 323 are superposed so that an angle of "0 (zero)" degrees is defined therebetween. If a completely plane wave (wavefront aberration=0) 322 is projected and if the lens 316 has no aberration, in each of the cases of FIGS. 31 and 32, what can be called a "one-color image" of constant intensity throughout all the picture elements of the sensor 318 (if it comprises a CCD), is obtainable. In FIG. 31, the original patterns U and L have no phase deviation and, therefore, the images of the patterns U and L have the same brightness. However, in FIG. 32, the original patterns U and L have a phase deviation δ and, therefore, the brightness of the image of the pattern L slightly differs from that of the image of the pattern U. FIGS. 33 and 34 each illustrates the interference fringe on the sensor 318 on an occasion when the half mirror 313 is tilted by a small angle as the reference light 321 and the diffraction light 323 are superposed, to cause interference. In FIG. 33, the original patterns U and L have no phase deviation and, therefore, the images of the patterns U and L have no phase deviation in interference fringe, such that an obtained brightness distribution is like that of one continuous image. In FIG. 34, the original patterns U and L have a phase deviation δ and, therefore, as illustrated, there is produced a phase deviation in the interference fringe of the images of the patterns U and L. As described, when the original patterns U and L have a phase deviation δ, even in the case of the "one color", the intensity changes in the image on the sensor or, if tilt is imparted to produce a pitch having fringe, deviation occurs in the interference fringe. Therefore, by detecting a phase deviation of the interference fringe as obtainable on the basis of the intensity on the sensor or the intensity distribution thereon, it is possible to detect a phase deviation δ between the original patterns U and L very precisely.

An example of a method of detecting a phase deviation of an interference fringe at high precision, is a fringe scan method which is known per se. In accordance with the fringe scan method, in an interferometer the optical path length of reference light is changed stepwisely and, by subjecting respective interference patterns to Fourier series synthesization, phase (deviation) of the interference fringe is detected. In FIG. 28, when the phase of the reference light is to be changed by the moving mechanism 314 such as a piezoelectric device, if it is changed by N times through an amount n times larger than $2\pi$ (one wave length), then, at the time of n-th scan, the phase shift quantity $\Delta$ is:

$$\Delta_n = 2\pi(n/N) \quad (n=1, 2, 3, \ldots, N) \tag{37}$$

If the intensity distribution of the interference pattern with $\Delta_n$ is $I(x', y', \Delta_n)$ where x' and y' are on directional axes of a coordinate system on the sensor 18 surface such as shown in FIGS. 29–34, and if the signal sampled at m-th time, namely, the intensity distribution of the interference fringe, is denoted by:

$$I(x',y',m) = a(x',y') + b(x',y')\cos[(2\pi m/N) + \phi(x',y')] \tag{38}$$

then, the phase $\phi(x',y')$ at point (x',y') is expressed as follows:

$$\phi(x',y') = \tan^{-1} \frac{(1/N)\sum_{n=0}^{N-1} I(x',y',\Delta_n)\cos\Delta_n}{(1/N)\sum_{n=0}^{N-1} I(x',y',\Delta_n)\sin\Delta_n} \tag{39}$$

By using the fringe scan method, while canceling the wavefront aberration of the optical system as an inherent, it is possible to obtain measurement precision for the wavefront deviation (deviation of interference fringe) of an order not greater than $\lambda/100$. Then, if the line-and-space ratio of the pattern (straight grating) is 1 micron, the phase deviation δ of the original pattern can be measured with a resolution not larger than (pitch/100)×2=0.02 (micron).

The inherent aberration involved in the optical system (313, 316, 317) can be measured as a phase deviation of the interference fringe, as obtainable when the patterns U and L are set with no misregistration on an article to be examined. Thus, to a sample of an unknown pattern phase deviation, such an inherent aberration may be corrected to calculate a measured value.

A more convenient method may be that, with regard to an image signal of an interference pattern such as shown in FIG. 34, an image area based on diffraction light from the pattern U and an image area based on diffraction light from the pattern L are extracted in the form of luminance signals of respective scan lines and then the deviation $\phi$ is calculated.

In any case, according to the present embodiment, straight diffraction grating patterns are printed on a wafer and coherent light is projected thereto, and diffraction light from the pattern and reference light directed along a separate path are superposed to form an interference fringe. The obtained interference fringe is detected as a phase deviation in accordance with the fringe scan method or by processing luminance signals of an image, whereby phase deviation of originally printed patterns is detected. This makes it possible to assure automatic measurement or high-precision measurement and, therefore, alignment precision or performance of a movable stage in a semiconductor exposure apparatus can be inspected at high precision.

Figure 35:
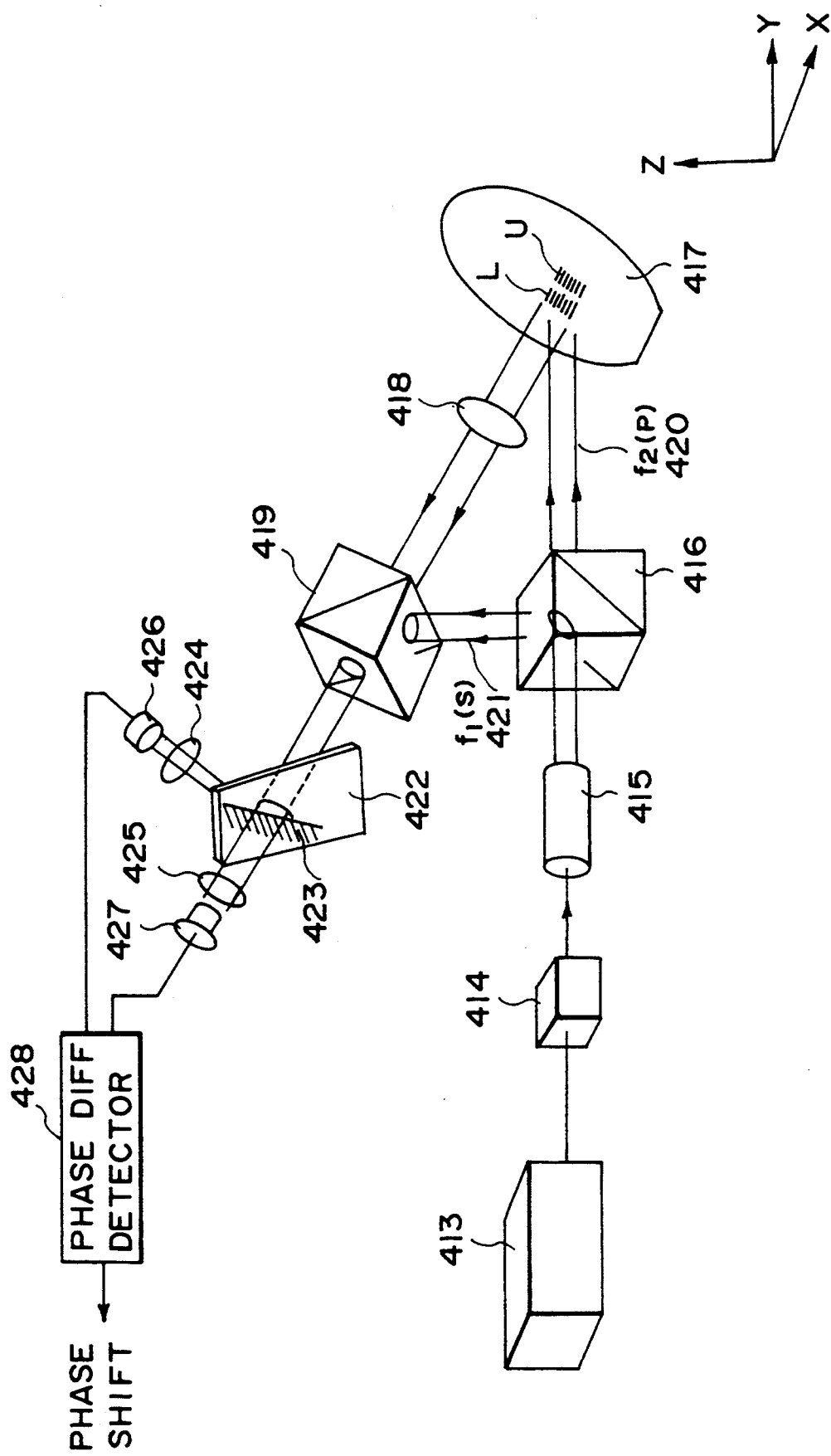

FIG. 35 shows a tenth embodiment of the present invention. Denoted in FIG. 35 at 413 is a laser; at 414 is a frequency shifter; at 415 is a lens for changing the beam diameter; and at 416 is a polarization beam splitter. Light emanating from the laser 413 is transformed by the frequency shifter 414 into two waves having slightly different frequencies. FIG. 36 shows, as an example, the structure of the frequency shifter 414. Denoted in FIG. 36 at 430 is a polarization beam splitter; at 431 and 433 are acousto-optic modulators; at 432, 435 and 436 are mirrors; and at 434 is another polarization beam splitter. If the modulator 431 is adapted to execute acousto-optic modulation of 80 MHz while the modulator 433 is adapted to execute acousto-optic modulation of 81 MHz, then a frequency difference of 1 MHz is produced between two lights and, as the lights of two wavelengths, waves having orthogonally intersecting polarization planes such as S-polarized light and P-polarized light, are obtainable.

Thus, in FIG. 35, the light passed through the lens 415 comprises waves having slightly different frequencies and having polarization planes intersecting orthogonally with each other. The light is then received by the polarization beam splitter 416. The light denoted at 420 is the light passed through the polarization beam splitter 416, which comprises P-polarized light of a frequency $f_2$ (wherein the electric vector is oscillating in the direction parallel to the refraction and reflection surface). Hereinafter, this light will be referred to as "light $f_2(p)$". The light denoted at 421 is reflection light reflected by the polarization beam splitter 416, which comprises S-polarized light of a frequency $f_1$. Hereinafter, this light will be referred to as "light $f_1(s)$".

The light $f_2(p)$ is projected onto grating patterns L and U, having been printed on a wafer 417, and is diffracted thereby. The diffraction light goes through a lens 418 and is received by the polarization beam splitter 419. After passing through the polarization beam splitter 419, the diffraction light is superposed with the light $f_1(s)$. However, considering of that their polarization planes intersect orthogonally with each other, polarization plates 124 and 425 are used to rotate the polarization setting by 45 degrees with respect to the direction of P- and S-polarization. By this, an interference signal is obtainable. Denoted at 426 and 427 are photosensors each comprising a quick-response Avalanche photodiode, for example. Denoted at 428 is a means (such as a lock-in amplifier, for example) for detecting a phase difference between two signals from the sensors 426 and 427, varying with respect to time at beat frequency. Denoted at 422 is a pattern edge mirror which is obtainable by vacuum deposition of a metal film such as chromium. This mirror is disposed at a position on which the patterns U and L of the wafer 417 are projected by the lens 418. The mirror is so set that the diffraction light from the pattern L is transmitted therethrough, while the diffraction light from the pattern U is reflected by the chromium film 423 of the mirror. With this structure, the signal of diffraction light from the pattern L and the signal of diffraction light from the pattern U can be separated from each other and can be directed to the sensors 427 and 426, respectively.

With the described structure, the phase deviation can be detected at the lock-in amplifier 428.

In FIG. 35, in order to detect and cancel inherent wavefront aberration of the optical system such as, for example, the aberration to be produced by the lenses 415 and 418 and the polarization beam splitters 416 and 419, measurement may be made under the condition that the grating patterns printed on the wafer have no phase deviation, and the phase output as obtainable under this condition from the lock-in amplifier 428 may be used as the inherent aberration of the optical system. While in this embodiment the laser 413 and the frequency shifter 414 are used to produce two wavelengths having a small difference in frequency and having polarization planes intersecting orthogonally with each other, in place thereof, a Zeeman laser (such as a transverse Zeeman laser wherein a magnetic field is applied perpendicularly to the optical axis, a transverse Zeeman laser in which a magnetic field is applied in a direction parallel to the optical axis, or the like) may be used.

FIG. 37 shows an eleventh embodiment of the present invention. Denoted in FIG. 37 at 441 is a light source; at 442 is a frequency shifter; at 443 is a beam expander; at 444 is a half mirror; at 445 and 451 are mirrors; and at 446 and 450 are polarization beam splitters. As shown in FIG. 37, light passed through the beam expander 443 and the half mirror 444 comprises a wave of S-polarization having a frequency $f_1$ and a wave of P-polarization having a frequency $f_2$. The light passed through the half mirror 444 is received by the polarization beam splitter 446 and, by the mirror 451, it is directed to the lens 447, whereby it is projected onto a grating pattern 449 on a wafer 448 surface. Here, reference character $f_1(s)$ denotes S-polarized light of the frequency $f_1$, while reference character $f_2(p)$ denotes P-polarized light of the frequency $f_2$. If the pitch of the grating 449 is denoted by P and when the light is so inputted as to satisfy the following relation:

$$P\sin\theta = \lambda \qquad (40)$$

wherein $\lambda$ is the wavelength, then diffraction light produced by the pattern 449 advances in a direction perpendicular to the wafer 448. Diffraction light produced by the diffraction of the light $f_1(s)$ is denoted by $f_1'(s)$, while diffraction light produced by diffraction of the light $f_2(p)$ is denoted by $f_2'(p)$. These diffraction lights are received by the polarization beam splitter 451, whereby the light $f_1'(s)$ is directed to a sensor 454, while the light $f_2'(p)$ is directed to a sensor 457. On the other hand, the lights $f_1(s)$ and $f_2(p)$ reflected by the half mirror 444 are directed to the mirror 445 and then to the polarization beam splitter 450 and, finally, the light $f_2(p)$ is directed to the sensor 454, while the light $f_1(s)$ is directed to the sensor 457. The lights directed to the sensor 454 are the light $f_1'(s)$ and the light $f_2(p)$. Since the polarization planes of these lights intersect orthogonally with each other, a polarization plate 452 having a polarization characteristic rotated by an angle of 45 degrees with respect to the direction of polarization of each of these lights, is disposed in front of the sensor 454.

When light is projected through the lens 447 so as to irradiate the entirety of the pattern 449 on the wafer 448 (like the patterns A and B in FIG. 2), the light is diffracted by the patterns A and B (FIG. 2) and diffraction lights are produced from these patterns, respectively. In order to assure that only the diffraction light from the pattern A is received by the photosensor 454 while only the diffraction light from the pattern B is received by the sensor 457, an aperture may be disposed at a position which is optically conjugate with the pattern 449 with respect to the lenses 447, 453 and 456 so as to block unwanted diffraction light to prevent the same from being received by the sensor. FIG. 38 shows a portion adjacent the sensor 454, in an enlarged view. Also, in front of the sensor 457, a similar aperture 461 may be disposed.

Referring back to FIG. 37, the lights directed to the sensor 457 are the light $f_2'(p)$ and the light $f_1(s)$. Also, in this case, similarly a polarization plate 455 is disposed in front of the sensor 457.

With the above-described arrangement, signals are applied to the lock-in amplifier, and a phase deviation of the pattern 449 on the wafer 448 (which may be set as the patterns A and B in FIG. 2) can be detected with high precision.

FIG. 39 shows a twelfth embodiment of the present invention. In this embodiment, the invention is applied to an exposure apparatus for measurement of misregistration of printed patterns on a wafer.

Denoted at 201 is a misregistration detecting unit; at 202 is a control unit to which an output signal of the misregistration detecting system and an output signal of a distance measuring means 207 for measuring the amount of movement of a stage 205 are applied. Denoted at 210 are integrated circuit pattern areas, and denoted at 211 are misregistration detecting patterns printed on scribe lines extending in the X-axis direction. Each of the patterns 211 comprises the patterns such as shown in FIG. 13. Denoted at 208 is a laser light source for the distance measurement; at 206 is an interferometer system unit; and at 214 is a mirror mounted on the stage 205, for measurement of the amount of movement of the stage. While in FIG. 39 only a single-axis moving mechanism for the stage 205 is illustrated, actually there is provided another single-axis moving mechanism, orthogonal to the illustrated axis. The misregistration detecting unit 201 is disposed at a position which is spatially separated from an imaging lens (not shown) provided for exposure of a wafer, and the stage 205 can be moved to a position underneath the misregistration detecting unit 201 for the measurement. This provides an advantage that the printing and the measurement of printing misregistration can be effected in the exposure apparatus.

In FIG. 39, denoted at 203 is a wafer; at 204 is a wafer chuck; at 209 is a vacuum tube; and at 212 are guides for the stage movement.

Figure 40:
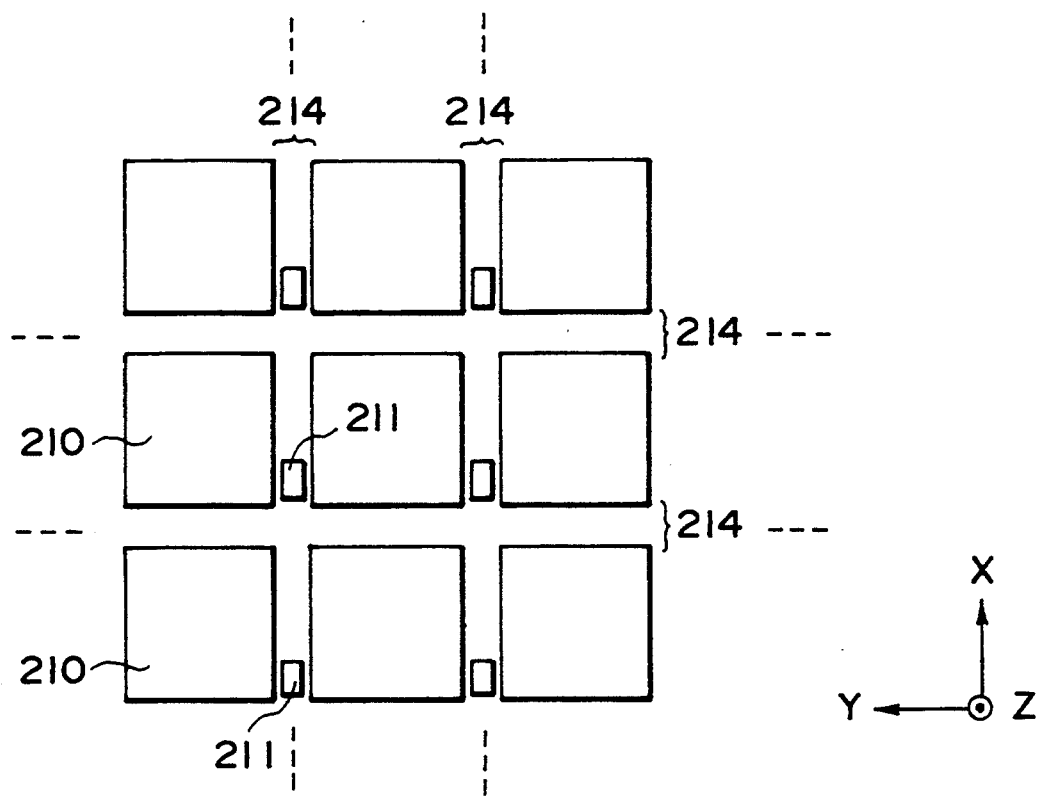

FIG. 40 shows the positional relationship of the integrated circuit pattern areas 210 of the printed patterns on the wafer 203 and the misregistration detecting patterns 211, for detecting misregistration with respect to the X-axis direction. In this example, each detecting pattern 211 is accommodated within a scribe line 214. However, each detecting pattern 211 may be formed in a corresponding integrated circuit pattern area 210.

Figure 41:
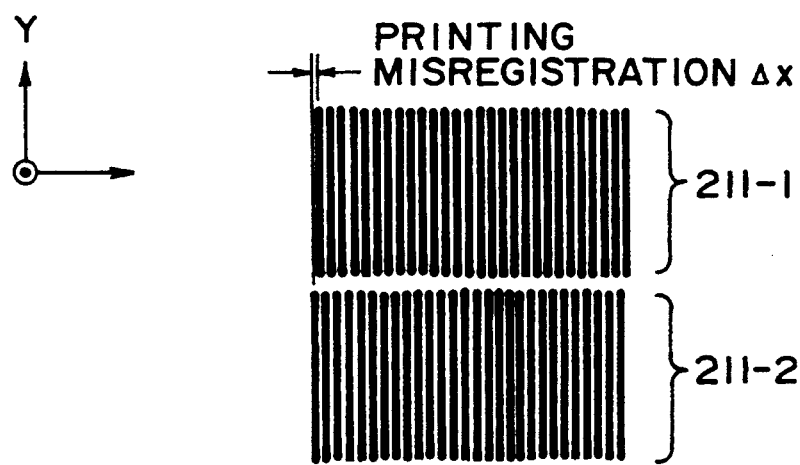

FIG. 41 shows an example of printing misregistration detecting patterns. Denoted at 211-1 is a printed pattern corresponding to an N-th layer, and denoted at 211-2 is a printed pattern corresponding to an (N+1)-th layer. These patterns have a printing misregistration $\Delta x$.

Figure 42:
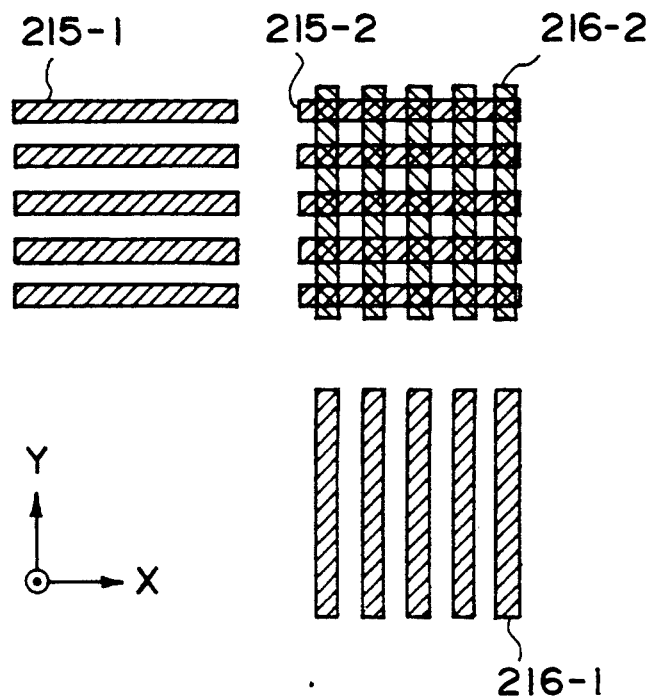

FIG. 42 shows another example of printing misregistration detecting patterns. In this example, misregistration with respect to both the X-axis direction and the Y-axis direction can be detected. The patterns 215-1 and 215-2 are used for the detection with respect to the Y-axis direction, while the patterns 216-1 and 216-2 are used for the detection with respect to the X-axis direction.

Figure 43:
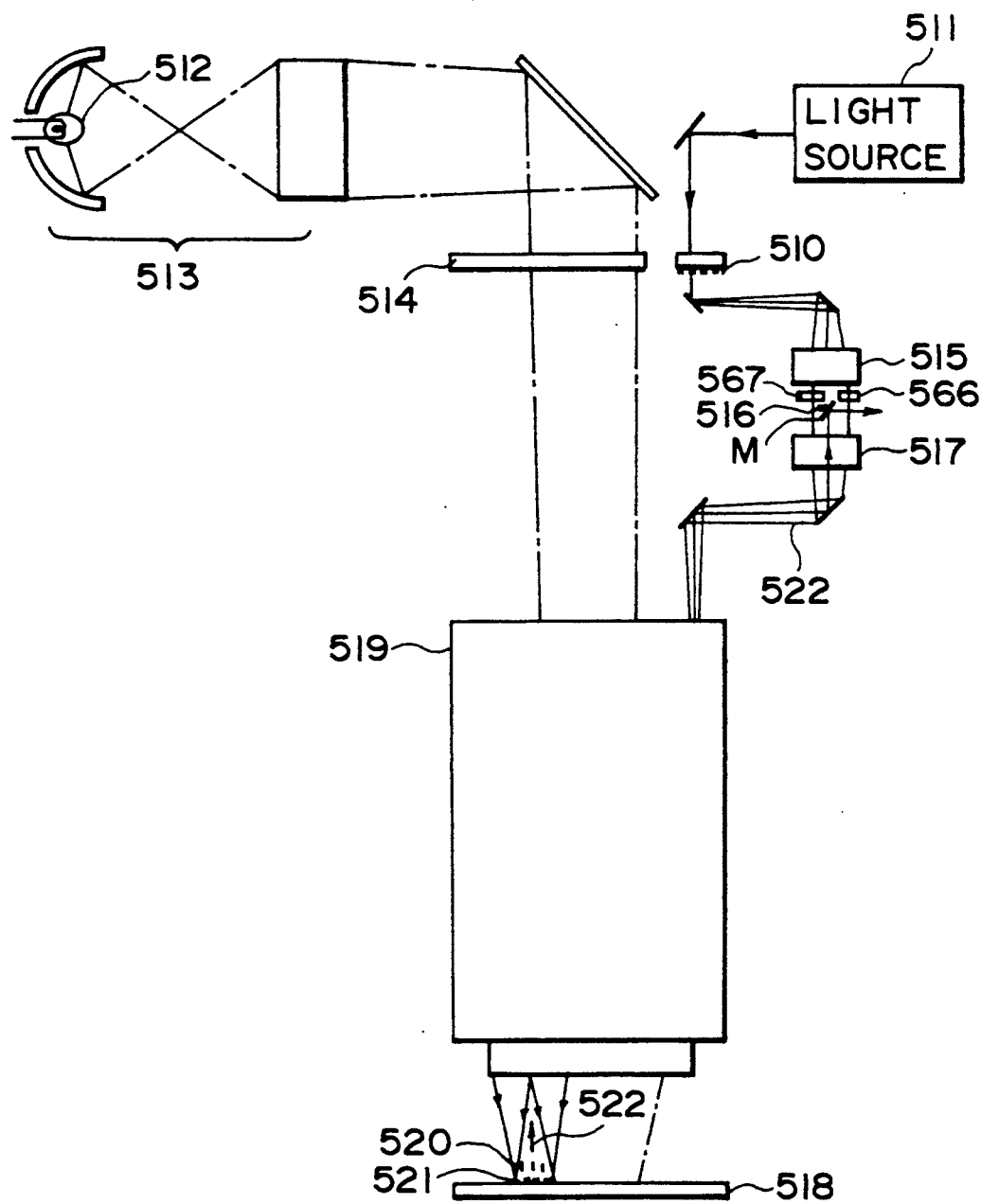

The present invention is also applicable to a reduction projection exposure apparatus called "a stepper", such as shown in FIG. 43. FIG. 43 illustrates a thirteenth embodiment of the present invention.

Light emanating from a light source 511 such as a Zeeman laser adapted to produce light of different frequencies, is inputted to a first lens system 515. Then, an image of a pattern of a grating 510, which serves as a secondary light source, is once focused by means of a first Fourier transform lens 515. Subsequently, the light is passed through a second Fourier transform lens 517 and, finally, the image of the first grating 510 is projected by a reduction projection optical system 51 9 onto a wafer 518. At the rear focal plane of the first Fourier transform lens 515, diffraction light from the first grating 510 is distributed spatially. In this embodiment, a spatial filter 516 (see FIG. 45) is disposed in this Fourier transform plane, whereby filtering in the spectral plane is effected. By the filtering of the pattern of the grating 510 in the spectral plane, an interference fringe 520 is produced on the wafer 518 surface. Denoted at 566 and 567 are polarization plates which are adapted to transmit P-polarized light (electric field plane parallel to the sheet of the drawing) and S-polarized light (electric field plane perpendicular to the sheet of the drawing), respectively. The semiconductor wafer 518 has a second grating 521 formed thereon which comprises gratings such as at 591 and 592 in FIG. 50, having been printed on the wafer as the first and second layers. By the second grating 521, diffraction light 522 is produced which goes through the reduction projection optical system 519 and the second lens 517 in the reverse direction, and it is directed by a small mirror, disposed at the position of the spatial filter 516, to a photodetector. The above described is an optical arrangement for detecting misregistration of printed semiconductor process patterns, printed on the wafer 518. Denoted in FIG. 43 at 512 is a light source for the pattern printing, at 513 is an illumination optical system, and at 514 is a reticle.

Figure 44:
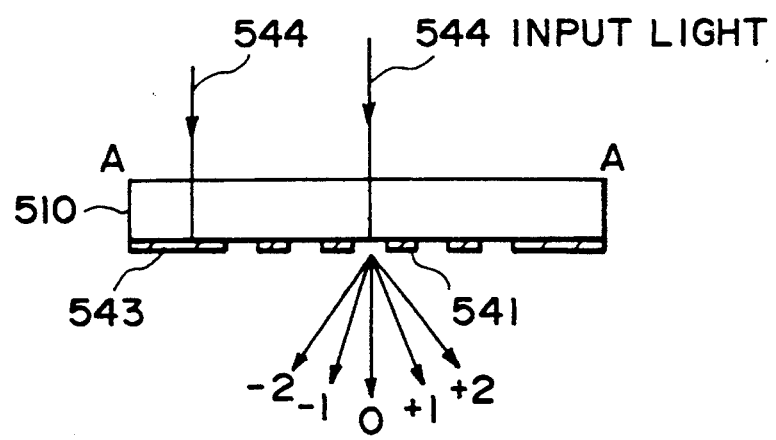

FIG. 44 is a sectional view showing diffraction as light is projected to the first grating 510 in FIG. 43. By the grating pattern 541, there are produced plural diffraction lights of zero-th order, positive and negative first orders, positive and negative second orders and the like. Light blocking portion 543 is formed around the grating pattern 541, by using a film of chromium or chromium oxide. With this light blocking portion 543, the input light 544 is allowed to pass through only the inside of the pattern 541. In the example of FIG. 44, an amplitude grating pattern such as at 541 is used to obtain diffraction lights. However, the grating may be a phase grating or, alternatively, it may be an echellet grating where the input light is incident obliquely.

Figure 45:
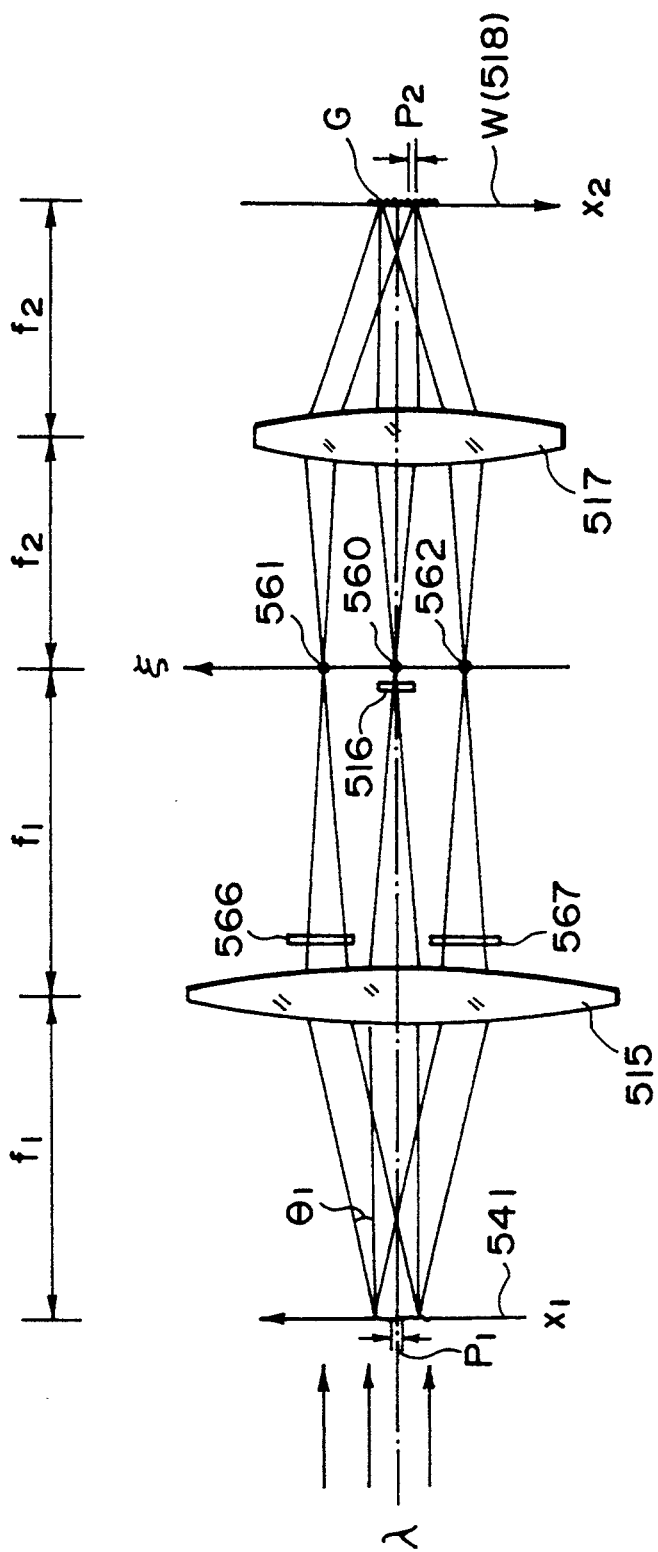

Referring now to FIG. 45, the principle of the present embodiment will be explained. The light emanating from the light source 511 and having a wavelength $\lambda$ illuminates a phase grating pattern 541 of the first grating 510. The phase grating pattern 541 is disposed at the front focal point $f_1$ position of the first Fourier transform lens 515. Between the pitch $P_1$ of the grating pattern 541 and the diffraction angle $\theta_1$ of the diffraction light, there is a relation:

$$P_1 \sin\theta_n = n \cdot \lambda (n=0, \pm 1, \pm 2, \ldots) \qquad (41)$$

The diffraction lights are incident on the Fourier transform lens 515 and, at the rear focal plane thereof, Fourier spectral images corresponding to the respective diffraction lights are formed, as shown in FIG. 46. The light corresponding to the Fourier spectrum of first order diffraction light forms an image on the Fourier transform plane, in a state completely separated from the Fourier spectrum of the zero-th order diffraction light. The spatial filter 516 is disposed in this Fourier transform plane to block the zero-th order diffraction light as well as diffraction lights of orders larger than positive and negative second orders, from the grating pattern 541. Thus, only positive and negative first order diffraction lights are allowed to pass. The light source 511, in this example, produces lights of slightly different frequencies, and it comprises a Zeeman laser, for example. The diffraction lights passing through the Fourier transform plane are received by the second Fourier transform lens 517 and are projected on the wafer 518. Denoted at 566 and 567 are polarization plates by which the lights passed therethrough are transformed into P-polarized light and S-polarized light, respectively. On the wafer 518, the positive and negative first order diffraction lights interfere with each other to produce an interference fringe of a different pitch $P_2$ which is given by:

$$P_2 = \lambda/2\sin\theta_2 \quad (42)$$

Here, since the Fourier transform plane of the first Fourier transform lens is set at the front focal plane of the second Fourier transform lens 517, there is a relationship:

$$f_1\sin\theta_1 = f_2\sin\theta_2 \quad (43)$$

Between the images passed through the first and second Fourier transform lenses 515 and 517 and through the reduction projection system (of a reduction ratio m) of the reduction projection optical system 519 shown in FIG. 43, there is a relation:

$$\begin{aligned} P_3 &= m \cdot (\lambda/2\sin\theta_2) = m(f_2/f_1) \cdot (\lambda/2\sin\theta_1) \\ &= m(f_2/f_1)(P_1/2) \end{aligned} \quad (44)$$

Therefore, if $f_1 = f_2$, the pitch $P_3$ of the interference fringe formed on the wafer W is equal to a half of the pitch of the projected image of the grating pattern 541. By the projected image of the grating 541, a second grating G is formed on the wafer W (518). When lights 611 and 612 such as shown in FIG. 47 are projected onto this grating G separately, by the wavefront dividing function of the grating G there are produced diffraction lights, respectively. Also, if the lights 611 and 612 are projected onto the wafer W (518) simultaneously, an interference fringe is produced. Further, in this case, the diffraction lights diffracted by the grating G on the wafer W (518) interfere with each other. By detecting such interference light through a photodetector, it is possible to obtain light intensity information that represents the positional relationship between the interference fringe and the grating G.

Figure 48:
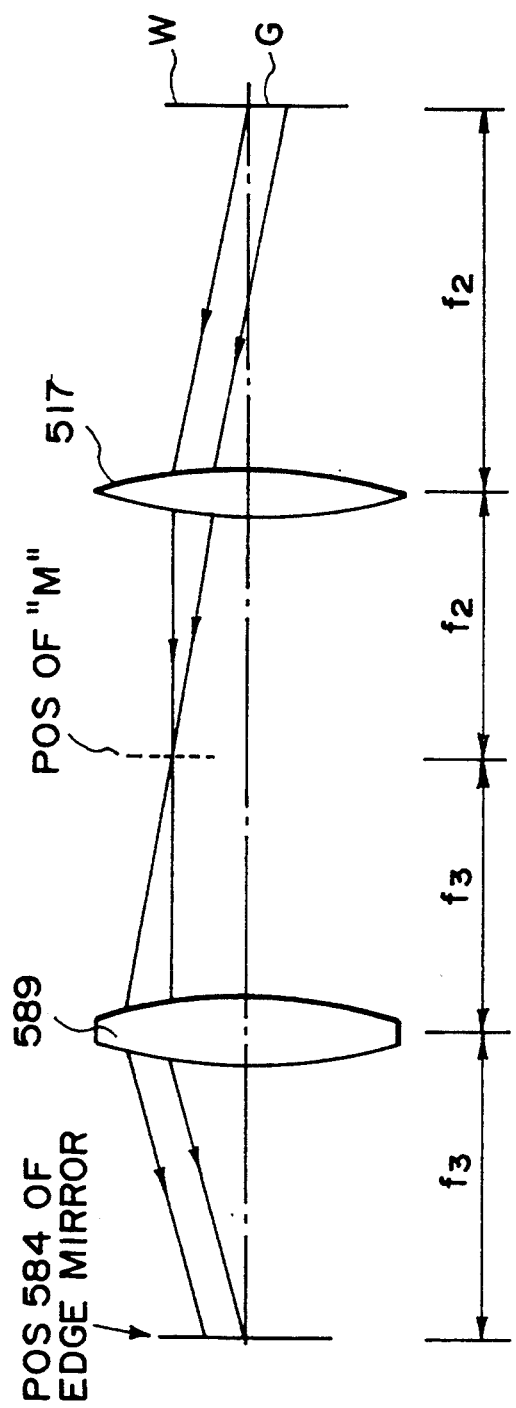
Figure 49:
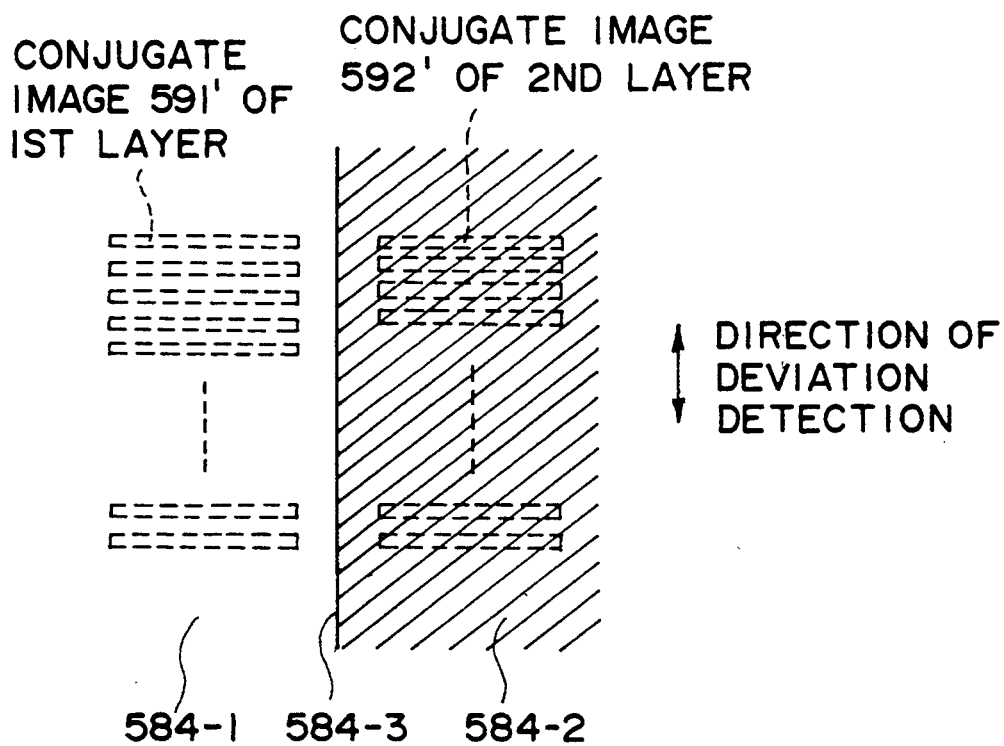
Figure 50:
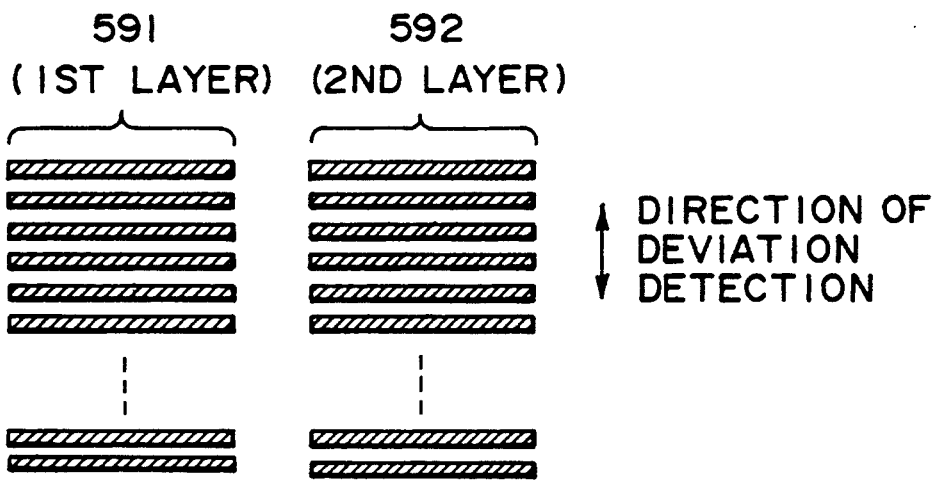

FIG. 48 shows the relationship between the wafer W and the edge mirror 584 (see FIG. 51) in relation to the lens 517, the small mirror M and the lens 589, as well as the relationship of the paths of lights diffracted by the grating G on the wafer W. The light diffracted by the wafer W goes through the lens 517 and is focused at the position of the small mirror M. After this, it goes through the lens 589 and is received by the edge mirror 584. Here, if the focal length of the lens 589 is denoted by $f_3$, the optical arrangement is such as shown in FIG. 48, wherein the edge mirror 584 and the wafer W are in an optically conjugate relationship with respect to the lenses 517 and 589. The grating pattern printed on the wafer W is such a pattern as shown in FIG. 50 and, on the edge mirror 584, the position of the grating pattern and the edge are in a relationship such as shown in FIG. 49. More specifically, as shown in FIG. 49, the light to be reflected by the edge mirror 584 is the light of a conjugate image of the pattern of the second layer, as depicted at 592'. On the other hand, the light to be transmitted through the edge mirror is the light of a conjugate image of the pattern of the first layer, as depicted at 591'. These lights are detected by a sensor 583 of quick response type such as an Avalanche photodiode or a Si sensor, for example. By subsequent phase detection through the lock-in amplifier 587, what can be called "optical heterodyne phase detection" of high-precision is attained and, by this, phase deviation of the grating printed on the wafer W, namely, printing misregistration, can be inspected. The polarization plates 580 and 581 are provided to cause interference of waves of two polarization planes which intersect orthogonally with each other. The light source 511 may comprise a dual-frequency producing laser such as a Zeeman laser, for example. Alternatively, an ordinary single-wavelength laser may be used in combination with an acousto-optic modulator means to produce lights of beat frequency oscillation. FIG. 52 shows a phase deviation with respect to time between a signal from the photosensor 582 and a signal from the photosensor 583.

When the fringe scan method such as described with reference to FIG. 28 is used in place of the optical heterodyne method, the light source 511 may be an ordinary single-wavelength oscillating laser and, in this case, as shown in FIG. 53 as a fourteenth embodiment of the present invention, the polarization plates 580 and 581 before the photosensors 591 and 592 are not necessary.

In accordance with the embodiments of the present invention having been described with reference to FIGS. 43 and the drawings following it, it is possible to provide an exposure apparatus by which printing misregistration on a wafer substrate can be detected very precisely. In the preceding embodiment, by means of the grating 541 diffraction light is projected on the wafer, but use of the grating 541 is not always necessary. In place thereof, a combination of a beam splitter and a mirror may be used to project light onto the wafer.

In accordance with the present invention, as described hereinbefore, in a semiconductor exposure apparatus, for example, after the printing is effected any printing misregistration can be measured. That is, for example, a first grating pattern is formed on a scribe line simultaneously with the printing of a first circuit pattern and, thereafter, the same wafer is aligned and a second grating pattern is formed on the scribe line together with a second circuit pattern. Any relative positional deviation between two grating patterns can be detected by detecting interference light of diffraction lights from the two patterns. This ensures high-precision measurement of relative positional deviation of two patterns.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for measuring positional relationship between first and second diffraction gratings, said apparatus comprising:
    light producing means for producing first and second light beams;
    a light projecting optical system for projecting a first portion of the first light beam to the first diffraction grating and for projecting a first portion of the second light beam to the second diffraction grating;
    a light receiving optical system for causing a first diffraction light beam, diffracted by the first diffraction grating, and a second portion of the second light beam to interfere with each other to produce a first interference light beam, and also for causing a second diffraction light beam, diffracted by the second diffraction grating, and a second portion of the first light beam to interfere with each other to produce a second interference light beam, said light receiving optical system comprising a light separating element for deflecting at least one of the first and second interference light beams, at a position substantially optically conjugate with at least one of the first and second diffraction gratings, to separate the one of the first and second interference light beams from the other;

a first light receiving element for detecting the first interference light beam and for producing a first output signal;

a second light receiving element for detecting the second interference light beam and for producing a second output signal; and signal processing means for detecting a phase difference between the first and second output signals to determine the positional relationship between the first and second diffraction gratings.

2. An apparatus according to claim 1, wherein the first interference light beam produces a first beat signal while the second interference light beam produces a second beat signal having the same frequency as that of the first beat signal, and wherein said signal processing means comprises means for detecting a phase difference between the first and second beat signals.

3. An apparatus according to claim 1, further comprising a member upon which the first and second diffraction gratings are provided.

4. An apparatus according to claim 1, wherein said light projecting means further projects the second portion of the second light beam to the first diffraction grating so that a third diffraction light beam is diffracted by the first diffraction grating and projects the second portion of the first light beam to the second diffraction grating so that a fourth diffraction light beam is diffracted by the second diffraction grating, and wherein said light receiving optical system further causes the first and third diffraction light beams to interfere with each other and also causes the second and fourth diffraction light beams to interfere with each other.

5. An apparatus according to claim 1, wherein said light receiving optical system further causes the first diffraction light beam and the second portion of the second light beam not diffracted by the first diffraction grating to interfere with each other, and the second diffraction light beam and the second portion of the first light beam not diffracted by the second diffraction grating to interfere with each other.

6. An apparatus according to claim 1, wherein said light separating element comprises an edge mirror.

7. A method of measuring positional relationship between first and second diffraction gratings, said method comprising the steps of:

producing first and second light beams;

projecting a first portion of the first light beam to the first diffraction grating and projecting a first portion of the second light beam to the second diffraction grating;

causing a first diffraction light beam, diffracted by the first diffraction grating, and a second portion of the second light beam to interfere with each other to produce a first interference light beam, and causing a second diffraction light beam, diffracted by the second diffracting grating, and a second portion of the first light beam to interfere with each other to produce a second interference light beam, said causing steps comprising deflecting at least one of the first and second interference light beams at a position substantially optically conjugate with at least one of the first and second diffraction gratings, to separate the one of the first and second interference light beams from the other;

detecting the first and second interference light beams to produce corresponding first and second signals; and detecting a phase difference between the first and second signals to determine the positional relationship between the first and second diffraction gratings.

8. An apparatus for measuring positional relationship between first and second diffraction gratings, said apparatus comprising:

light producing means for producing first and second light beams;

a light projecting optical system for projecting the first light beam to the first diffraction grating and for projecting the second light beam to the second diffraction grating;

a light receiving optical system for causing a first diffraction light beam diffracted by the first diffraction grating and a second diffraction light beam diffracted by the second diffraction grating to interfere with other to produce an interference light beam, said light receiving optical system comprising a wave combining element for shifting the first and second diffraction light beams each in a direction perpendicular to their direction of advancement and for wave-combining the first and second diffraction light beams;

a light receiving element for detecting the interference light beam and for producing an output signal; and signal processing means for detecting a phase of the output signal of said light receiving element to determine the positional relationship between the first and second diffraction gratings.

9. An apparatus according to claim 8, wherein said wave combining element comprises a Savart plate.

10. An apparatus according to claim 8, wherein the first and second light beams have different frequencies, and wherein said signal processing means detects the phase of a beat signal produced as a result of interference of the first and second light beams.

11. An apparatus according to claim 8, further comprising reference signal producing means for producing a reference signal, and wherein said signal processing means detects a phase difference between the reference signal and the output signal of said light receiving element.

12. A method of measuring positional relationship between first and second diffraction gratings, said method comprising the steps of:

producing first and second light beams;

projecting the first light beam to the first diffraction grating and projecting the second light beam to the second diffraction grating;

causing a first diffraction light beam diffracted by the first diffraction grating and a second diffraction light beam diffracted by the second diffraction grating to interfere with each other to produce an interference light beam, said causing step comprising combining the first and second diffraction light beams by shifting, through a wave combining element, the first and second diffraction light beams each in a direction perpendicular to their direction of advancement;

detecting the interference light beam with a light receiving element and producing an output signal; and detecting a phase of the output signal of the light receiving element to determine the positional relationship between the first and second diffraction gratings.

13. An apparatus for measuring positional relationship between first and second diffraction gratings, said apparatus comprising:

light producing means for producing a light beam;

a light projecting optical system for projecting a first portion of the light beam to the first and second diffraction gratings;

an interference optical system for causing a first diffraction light beam, diffracted by the first diffraction grating and a second portion of the light beam to interfere with each other to produce a first interference light beam, and also for causing a second diffraction light beam, diffracted by the second diffraction grating, and the second portion of the light beam to interfere with each other to produce a second interference light beam, said interference optical system comprising optical path length changing means for changing an optical path length of at least one of the first and second diffraction beams and the second portion of the light beam;

light receiving means for detecting the first and second interference light beams; and signal processing means for detecting a change in at least one of the first and second interference light beams due to a corresponding change in path length of at least one of the first and second diffraction light beams and the second portion of the light beam, changed by said optical path length changing means, to determine the positional relationship between the first and second diffraction gratings.

14. An apparatus according to claim 13, wherein said optical path length changing means changes the optical path length of the second portion of the light beam.

15. A method of measuring positional relationship between first and second diffraction gratings, said method comprising:

producing a light beam;

projecting a first portion of the light beam to the first and second diffraction gratings;

causing a first diffraction light beam, diffracted by the first diffraction grating and a second portion of the light beam to interfere with each other to produce a first interference light beam, and causing a second diffraction light beam, diffracted by the second diffraction grating and the second portion of the light beam to interfere with each other to produce a second interference light beam, said causing steps comprising changing an optical path length of at least one of the first and second diffraction light beams and the second portion of the light beam;

detecting the first and second interference light beams; and detecting a change in at least one of the first and second interference light beams, resulting from said optical path length changing, to determine the positional relationship between the first and second diffraction gratings.

16. An exposure apparatus comprising:

exposing means for lithographically transferring a pattern onto a workpiece;

an illumination system for illuminating first and second diffraction gratings, formed on the same plane of the workpiece by said exposure means;

a detecting system for detecting interference light produced from light beams respectively diffracted by the first and second diffraction gratings; and signal processing means for detecting the positional relationship between the first and second diffraction gratings on the basis of the detection by said detecting system.

* * * * *

UNITED STATES PATENT AND TRADEMARK OFFICE
CERTIFICATE OF CORRECTION

PATENT NO. : 5,333,050
DATED : July 26, 1994
INVENTOR(S) : Noriyuki NOSE, et al.

It is certified that error appears in the above-indentified patent and that said Letters Patent is hereby corrected as shown below:

On the title page, item [54] and column 1, line 3, "MEAUSRING" should read --MEASURING--.

COLUMN 10:

Line 6, "light" should read --lights--.

COLUMN 21:

Line 58, "51 9" should read --519--.

Signed and Sealed this

Twenty-seventh Day of December, 1994

Attest:

BRUCE LEHMAN

Attesting Officer

Commissioner of Patents and Trademarks